(12) United States Patent
Regnier et al.

(10) Patent No.: US 8,614,398 B2
(45) Date of Patent: Dec. 24, 2013

(54) GROUND TERMINATION WITH DAMPENED RESONANCE

(75) Inventors: Kent E. Regnier, Lombard, IL (US); Patrick R. Casher, North Aurora, IL (US)

(73) Assignee: Molex Incorporated, Lisle, IL (US)

(*) Notice: Subject to any disclaimer, the term of this patent is extended or adjusted under 35 U.S.C. 154(b) by 366 days.

(21) Appl. No.: 12/918,898

(22) PCT Filed: Jul. 22, 2009

(86) PCT No.: PCT/US2009/051409
§ 371 (c)(1),
(2), (4) Date: Jan. 18, 2011

(87) PCT Pub. No.: WO2010/011753
PCT Pub. Date: Jan. 28, 2010

(65) Prior Publication Data
US 2011/0100694 A1   May 5, 2011

Related U.S. Application Data

(60) Provisional application No. 61/082,777, filed on Jul. 22, 2008.

(51) Int. Cl.
*H05K 1/11* (2006.01)

(52) U.S. Cl.
USPC .................................. 174/261; 361/794

(58) Field of Classification Search
USPC .................... 174/250, 260, 261; 361/794
See application file for complete search history.

(56) References Cited

U.S. PATENT DOCUMENTS 7,267,575 B1   9/2007   Hwang

OTHER PUBLICATIONS

International Search Report for PCT/US2009/051409.

*Primary Examiner* — Jeremy Norris
(74) *Attorney, Agent, or Firm* — Stephen L. Sheldon

(57) ABSTRACT

A system of dampening resonance is provided. In an embodiment, ground traces may be coupled to a common or ground plane via dampening elements such as resistors a predetermined distance from a non-dampened coupling. Ground terminals in a connector have with a separated electrical length that allows for a potential to exist between the ground terminal and a common ground. When the ground terminals are coupled to the ground traces, the dampening element, which may be a resistor, helps convert energy traveling over ground terminal into heat, thus reducing or preventing resonance conditions in the connector.

16 Claims, 21 Drawing Sheets

GROUND TERMINATION WITH DAMPENED RESONANCE

REFERENCE TO RELATED APPLICATIONS

This application claims priority to PCT Application No. PCT/ US09/051409, filed Jul. 22, 2009, which in turn claims priority to Provisional Application Ser. No. 61/082777, filed Jul. 22, 2008, which is incorporated herein by reference in its entirety.

BACKGROUND OF THE INVENTION

Connectors are used in a variety of electronic devices and many of these devices are data-transfer devices that are used to transmit data at data rates of 1 Gbps and higher. Cable assemblies are used to connect two or more devices together and it is desirable to maintain a continuity of impedance through the cable assembly and the mating interface because impedance mismatches and discontinuities can create signal reflections that generate noise. Electrical cables and printed circuit boards are examples of structures that can include single, continuous grounds in the form of, for example, a large ground plane in a circuit board or an extensive shield in a cable. One benefit of such a shared ground plane is that a common reference corresponding to each signal transmission line has a common voltage level (e.g., the difference in potential between the ground associated with one signal pair and the ground associated another signal pair at a particular point along the transmission path approaches zero).

However, when a circuit board is coupled to a connector, the commonality of the ground structure is lost in the connector because each signal pair is usually associated with a different ground terminal(s) within the connector. Because of different energy levels due to resistance in the ground path for each signal path, when the various grounds are rejoined, they each will tend to have a different voltage and the differences will cause noise to be transmitted along the transmission line.

For example, many board connectors often include two grounds terminals that lie on opposing sides of a pair of signal terminals that function as a differential pair. Each ground terminal can have a different potential due to its position with respect to the differential pair. The potential on each ground terminal can also be affected based on the position of other signal pairs. As such, each separated ground terminal tends to have a different potential compared to other ground terminals. When these ground terminals are joined again (e.g., are terminated to a common ground plane), the difference in potential creates an energy wave that can reflect through the connector (creating noise on the signal transmission pairs). Increasing the frequency of the created energy wave brings the wave length of the created energy wave closer to the separated electrical length of the ground terminal As the frequency of the created energy wave approaches the separated electrical length the created energy wave will tend to create a resonance that can significantly add to the noise level for the frequency range of interest.

The resonance occurs in what can be referred to as a resonant structure and the boundaries of this resonant structure can be equated with the separate electrical length of the terminal from a first point where the ground conductor is no longer associated with a single, continuous (e.g., shared) ground but is instead separate and thus can have a potential compared to other ground terminals to a second point where the separate ground conductor is commoned. The region that provides the separate electrical length is where the potential imbalance occurs and this is also where resonance can occur.

The noise resulting from the resonance leads to degradation in signal integrity. As can be appreciated, shortening the connector can help increase the resonance frequency of the connector. Physically, however, there are limits on how small the connector can be made and still allow the connector to function as intended. Therefore, certain people would appreciate connector system that could function at higher frequencies.

SUMMARY OF THE INVENTION

In an embodiment, a connector with a paddle card is provided where the paddle card includes a first and second end and a first and second ground trace that are separate on the first end of paddle card and are joined at a common area which is positioned toward the second end. Positioned between the first and second ground trace is a third ground trace that extends to the common area. The first and second ground trace are coupled to the third ground trace via a first and second dampening element with the dampening elements positioned a predetermined distance from the common area. The dampening elements may be resistors.

In another embodiment, a circuit board and connector system is provided. The connector includes a first and second ground terminal The first and second ground terminals have an effective separated electrical length. The connector is coupled to the circuit board and the circuit board include a first ground trace that is coupled to the first ground terminal and a second ground trace that is coupled to the second ground terminal The first and second ground traces separately extend to a first and second via and both the first and second via both coupled to a common ground plane. The first and second ground trace further include a dampened connection to the common ground plane and the dampened connection on both the first and second ground trace is positioned a predetermined distance from the first and second via. The predetermined distance can be configured so that it is equivalent to an electrical length that is a fraction of the maximum separated electrical length of the terminals. The terminals may be coupled to the ground traces via surface mount technology or via thru-hole technology.

BRIEF DESCRIPTION OF THE DRAWINGS

In the course of this detailed description, reference will be frequently made to the attached drawings in which.

DETAILED DESCRIPTION OF THE PREFERRED EMBODIMENTS

Figure 1:
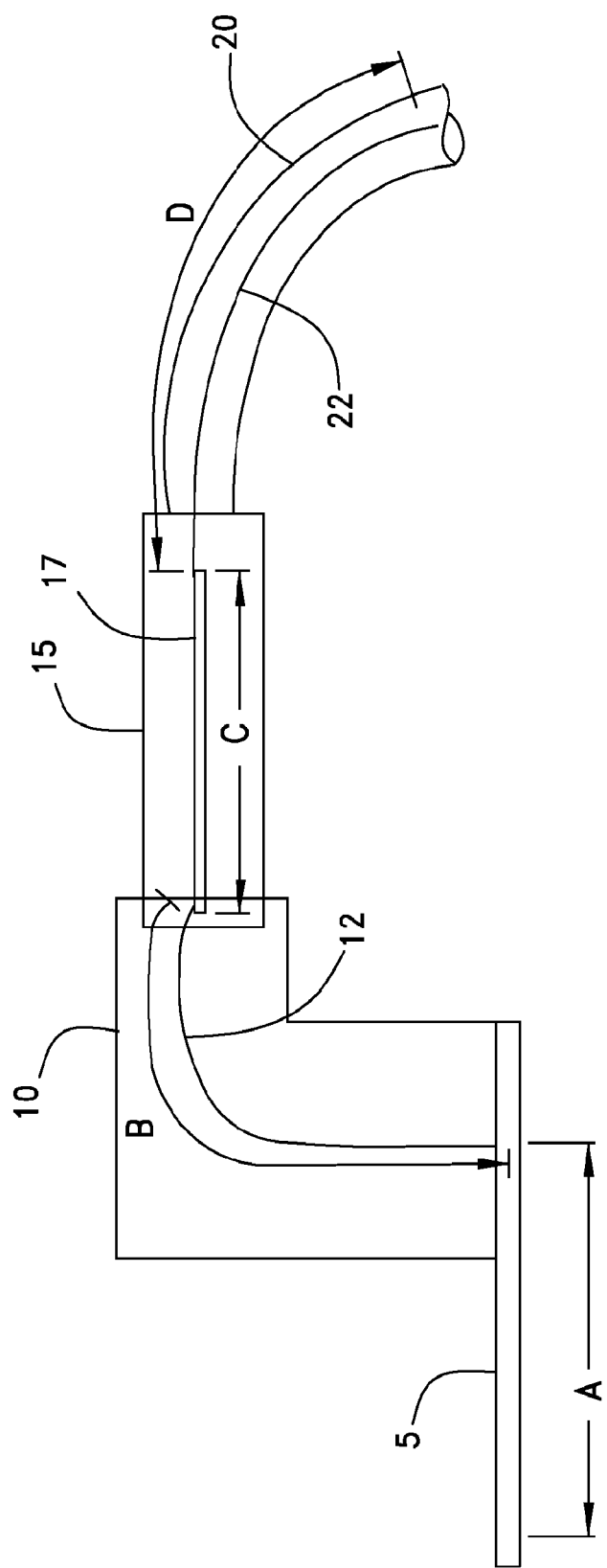
FIG. 1 is a schematic view of a connector system illustrating electrical lengths of conductive elements positioned therein.

Before discussing certain features it detail, it should be noted that the features provided below may be used in combination with other features. Accordingly, this application is not intended to be limited to the depicted combinations but instead is intended to include additional combinations that would be appreciated as alternatives by a person of skill in the art, even if the particular combination is not expressly depicted or discussed herein.

The most "basic transmission line" consists of two conductors. It supports a single mode of propagation that extends down to DC, 0 Hz. This single mode of propagation is commonly referred to as single-ended.

When additional conductors are added, a more "complex transmission line structure" is formed. This more complex transmission structure can support additional modes of propagation. Two traditionally discussed modes of propagation are the differential and common modes. In general, the more conductors that are added to the transmission line the more modes it can support. Typically, the differential mode is the intentional mode of propagation that is used for data communication between two systems. The common mode is typically an unintentional mode that is excited by imperfections in systems. There are additional undesirable modes that can also be supported in complex transmission structures. These modes do not have specific names.

Furthermore, as more conductors are added to the basic transmission line the more complex the propagating modes become. A single mode of propagation (i.e. the differential mode) will have different components that may not propagate consistent with one another. For example, in a G S S G transmission structure the two grounds are typically not electrically ideal. This leads to the formation of a $G_1$ S S $G_2$ transmission structure. In this structure, since there is an electrical potential difference between $G_1$ and $G_2$ there will be a modal component between them. In other words, the two different grounds can effectively act as a basic transmission line within a complex transmission structure.

Whenever a transmission line has a pair of discontinuities, that transmission line will have a resonant frequency that is dependent on the length between the discontinuities. This is also true for basic transmission line within a complex transmission structure. For a $G_1$ S S $G_2$ case with discontinuities on $G_1$ and $G_2$, the modal component between $G_1$ and $G_2$ of the complex transmission line will have a resonant frequency. Energy carried by those two conductors can resonate. As a result, that portion of the total modal energy will not efficiently make it through and out the other side of the transmission structure. This can be seen in the differential insertion loss, where there will be a performance "suck-out" at the resonant frequency. The depth of this suck-out depends upon the relative portion of the total model energy that is supported by the two non-ideal grounds $G_1$ and $G_2$.

Any transmission line structure that has less complexity (conductors) is more desirable with respect to this discussion. A printed circuit board has a common high-speed ground reference plane, while connectors used with printed circuit boards have multiple discrete ground terminals. These multiple ground terminals usually connect between common ground planes of two different printed circuit boards. This creates two undesirable issues. The multiple non-ideal grounds in the connector and the interface of these grounds to the more ideal grounds of the printed circuit boards. This leads to energy resonating on the discrete non-ideal ground terminals within the connector.

To address this resonant structure a system of connecting the grounds within the connector to the common grounds of the printed circuit boards has been developed. In an embodiment, a circuit board is provided that can be used with cable assemblies and board-mounted connectors for controlling resonance occurring within the resonant structure of the connector system at the connector and circuit card/circuit board level by conditioning the grounds on the circuit card or board. The open-ended ground members are connected, or shorted, together proximate to the openings by individual dampening elements, preferably resistors (it should be noted that other convention circuitry that provides similar dampening may also be used). The dampening elements provide a means for absorbing some of the energy caused by a variation in the voltage potential of separate ground terminals. The dampening elements serve to condition the grounds in the paddle card and placement of the dampening elements near the boundary between the connectors and sufficiently far enough from a common area helps ensure that the resonant energy is reliably dampened.

Another embodiment includes a paddle card for use with a cable assembly in which the paddle card incorporates a plurality of ground members extending within a common plane, one of the ground members being a primary ground path and the other ground member being a secondary path, the two paths being shorted together by one or more resistive elements that dissipate energy. The two paths are joined together in a common area. The distance of the one or more resistive elements from the common area can be configured to correspond to at least a fraction of a separated electrical length of a terminal in a mating connector.

FIG. 1 illustrates a schematic representation of an exemplary connector system. A board 5 supports a connector 10. A plurality of terminals 12 are positioned in the connector 10 and electrically couple the board 5 to a connector 15. The connector 15 supports an edge card 17 and when the connector 15 is mated to the connector 10, contacts on the edge card 17 are electrically coupled to the terminals 12. Wires 22 in cable 20 are mounted to the edge card 17 and allow signals from the board 5 to be transmitted to another location (e.g., a different board not shown).

Figure 1A:
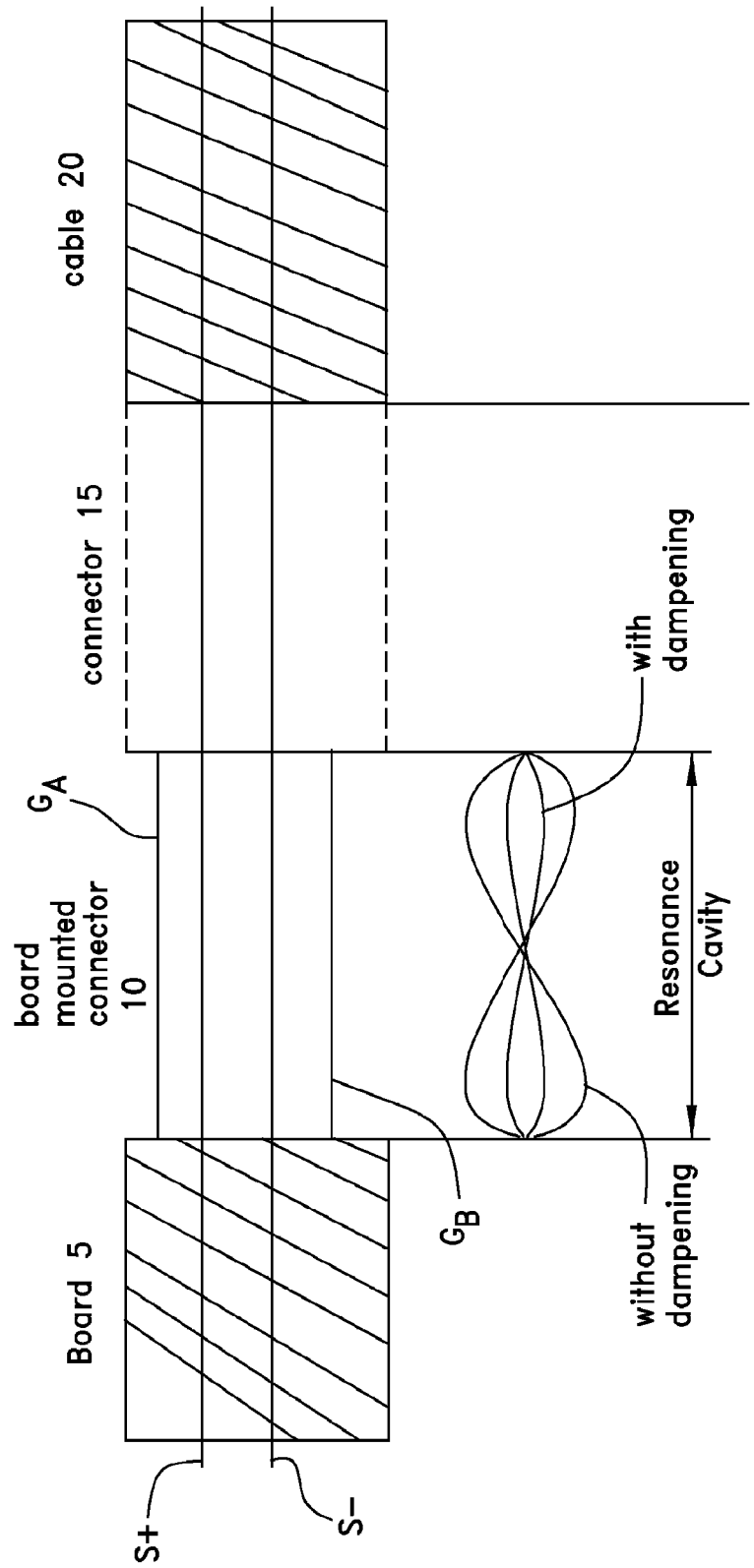
FIG. 1A illustrates a diagram of the connector depicted in FIG. 1.

FIG. 1A is a schematic diagram that illustrates additional features of the system depicted in FIG. 1. A circuit board 5 is electrically coupled to terminals 12 in connector 10 and the terminals 12 are electrically coupled to a paddle card 17, and the paddle card 17 is electrically coupled to wires 22 in the cable 20. This allows the S+ and S− terminals to send a signal through the system using differential signaling. While it would be ideal to have only differential signaling, in practice it tends to be beneficial to include a ground return to help provide control. The proximity of the signal pair and the ground conductor therefore creates a common mode signal that traverses the ground. In locations where the ground is shared (such as in the board 5 and cable 20), the electrical structure can have a continuous common ground to which the signal traces or wires can use as a reference and return. Similarly, the connector 15 can also include a paddle card with a shared or commoned ground. One problem providing common grounds on both sides of the connector 10, however, is that the grounds usually are separated in the connector 10. The area between the locations where the grounds are separated provides an electrical length where potentials between two grounds can vary. This variance in potential can create a resonant structure. In particular, the separate grounds could each have a potential with respect to each other and this variation in potential can create a standing signal wave on the grounds and therefore cause undesired noise on the signal pair.

Typically the junction between the board 5 and the paddle card 17 is where the ground is split onto multiple terminals 12. It has been determined that the separated electrical length of the ground terminals can act to form a resonance chamber for signaling frequencies that have a wavelength that approaches the separated electrical length. As can be appreciated, if the resonance is not dampened, the resulting standing wave can be significant.

Figure 2:
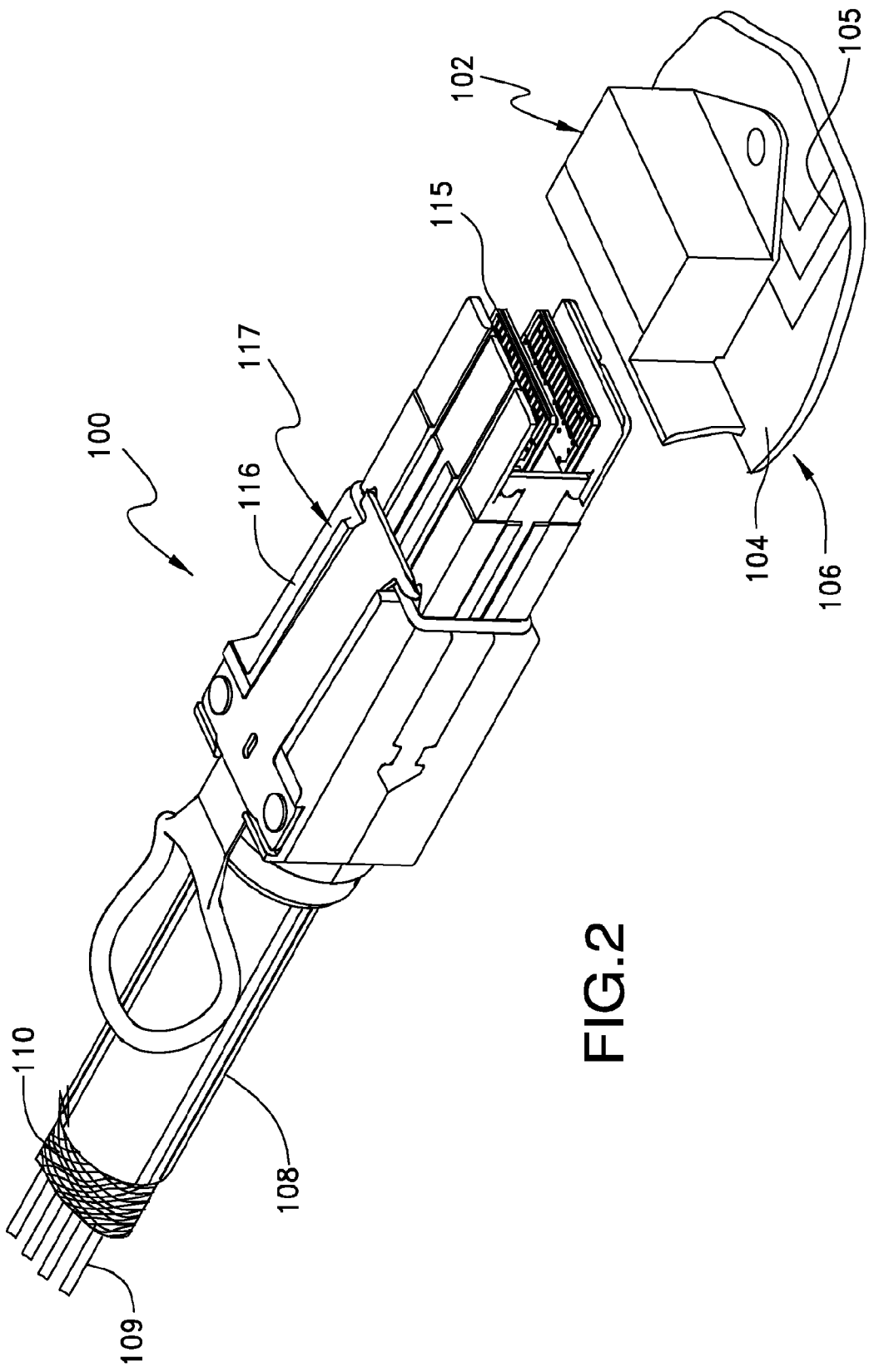
FIG. 2 is an isometric partially exploded view of an embodiment of a connector system.
Figure 3:
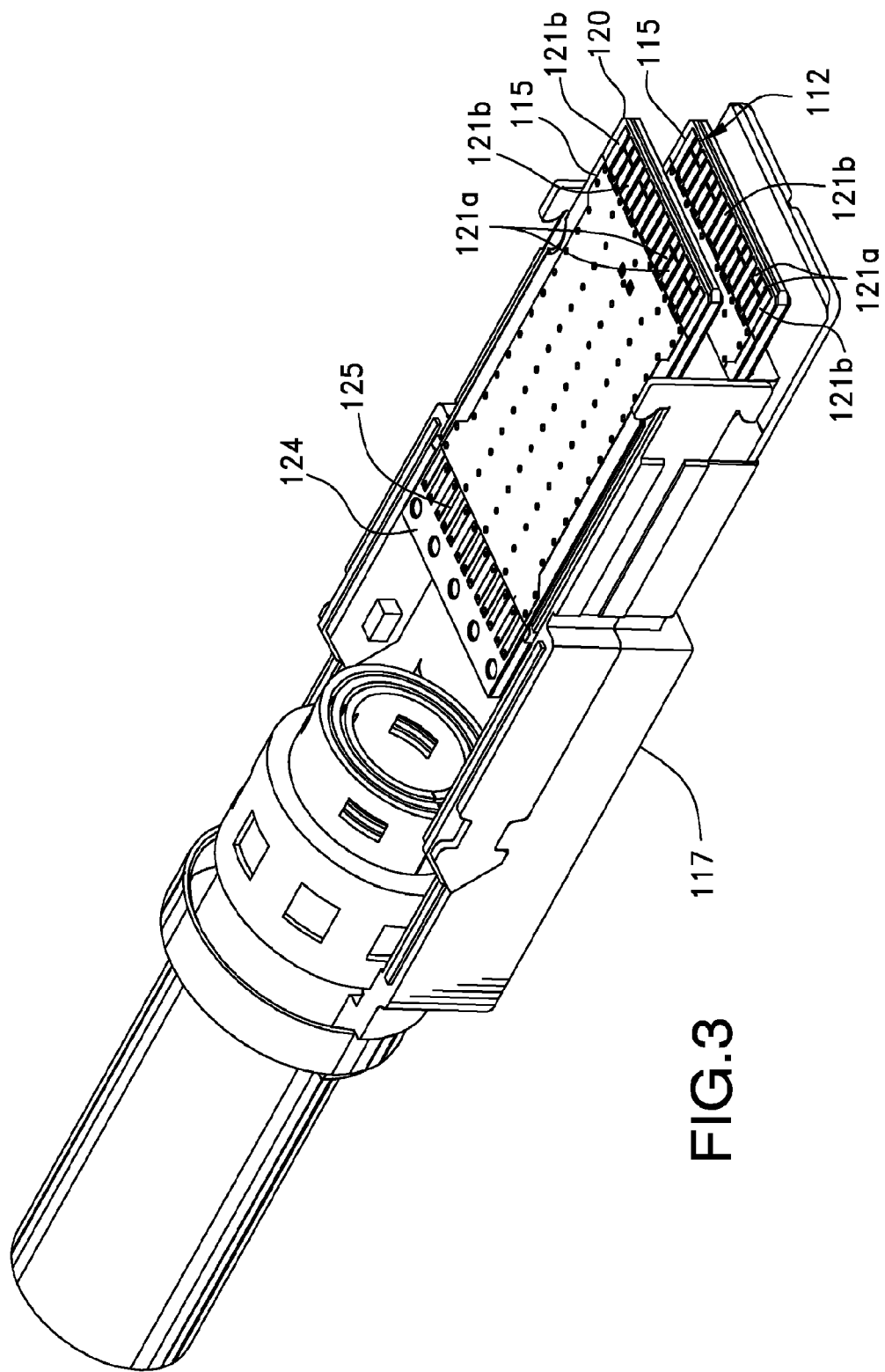
FIG. 3 is an exploded view of a cable connector depicted in FIG. 2.

FIG. 2 illustrates a cable connector 100 that can be used to mate with a board connector 102, so named because it is mounted on a circuit board 104 that is mounted within an electronic device 106, such as a server, router, memory storage or the like. The connector 100 typically includes a cable 108 that houses a plurality of signal transmission wires 109, with pairs of such wires making up respective differential signal transmission pairs. The wires 109 can be enclosed within a continuous metal shield 110 that extends around the wires 109. The wires 108 are individually terminated (termination not shown) to circuit traces disposed on an internal circuit card 115, referred to in the art and in this description as either an "edge card" or a "paddle card." FIG. 3 shows the cable connector 100 without its top portion 116 of the connector housing 117. Two paddle cards 115 are shown in a stacked format, one above the other with a predetermined vertical spacing. These two paddle cards 115 are received in a pair of cards-receiving slots, also not shown, in the opposing mating board connector 102 in order to effect a connection between the wires 109 and circuits 105 on the circuit board 104 of the device 106. Thus, as can be appreciated, the paddle card includes a first end and a second end and includes traces that extend between the first and second end. The paddle card typically includes at least one signal layer and one ground layer. It should be noted that the paddle card can be constructed in a convention multilayer manner similar to how conventional circuit boards are manufactured. The paddle card can also be formed of a molded dielectric material with a signals traces extending along in one layer (e.g., on one side) and ground traces extending along another layer. As can be appreciated, the use of two or more paddle cards in a stacked arrangement is beneficial for increasing the density of the connection but is not required.

As shown in FIG. 3, the paddle cards 115 can be seen to have a leading edge 120 which is received within a card-receiving slot of the mating connector 106 and as such, the card 115 includes a plurality of contact pads 121a, 12b that are arranged in a spaced-apart fashion widthwise of the card 115. These contact pads are further shown in an arrangement with a pair of signal contact pads 121a flanked by two adjacent ground contact pads 121b. The cards 115 each have a trailing edge 124 on a second end that is spaced apart lengthwise of the paddle card 115 and opposite the leading edge 120 on a first end. It is along this trailing edge 124 where a plurality of conductive termination pads 125 are arranged and each such termination pad 125 can be contacted by a single wire 109 of the cable 108 and attached thereto such as by soldering or the like.

Figure 3A:
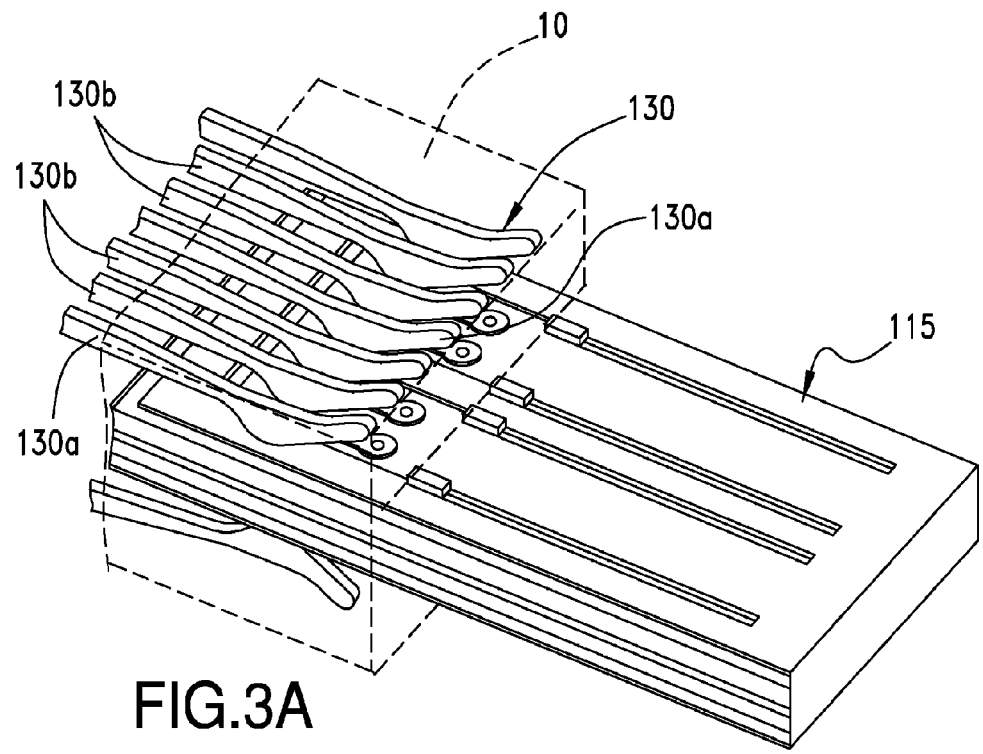
FIG. 3A is an enlarged detail view of an embodiment of a partial connector system that includes a paddle card mating with terminals.

As illustrated in FIG. 3A, the ground reference plane of the paddle card 115 is split into multiple grounds in the form of traces 121b and the traces 121b are configured to engage ground terminals 130a of the board connector 106 and which flank the pair of differential signal terminals 130b. The terminals can be arranged within the board connector 102 in repeating G-S-S or G-S-S-G pattern. The ground terminals 130a of the board connector will typically flank the differential signal pair of terminals 130b and, as such, they will exhibit an affinity to the nearest signal terminal of the signal pair as well as to the farthest signal terminal of the signal pair. These two flanking ground terminals 130a therefore tend to exhibit different potentials which may be out of phase.

Figure 3B:
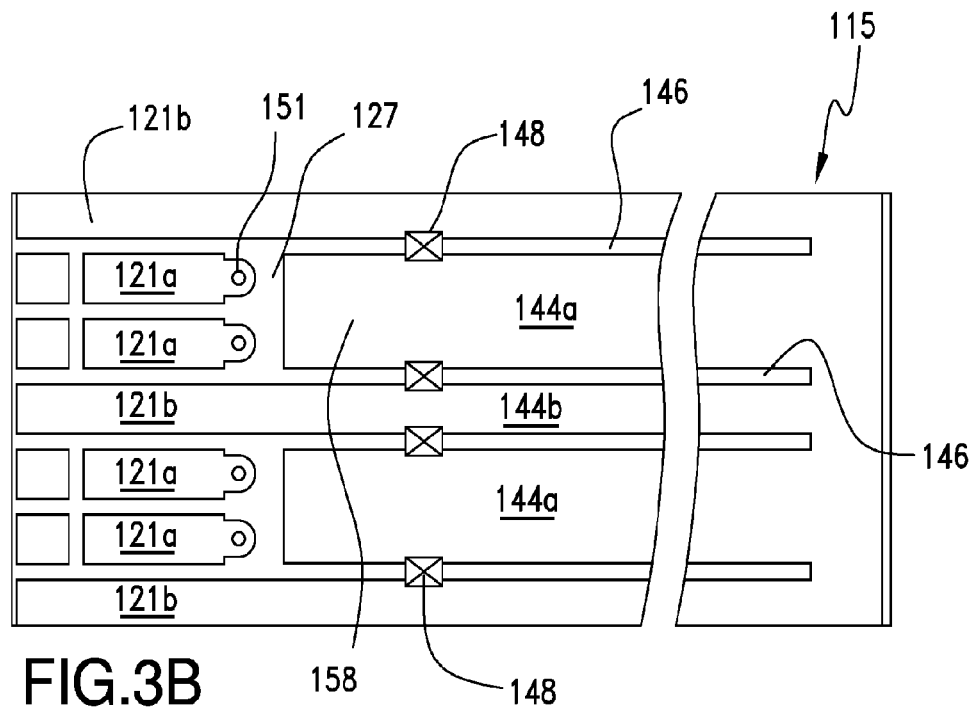
FIG. 3B is a top plan view of the paddle card shown in FIG. 3.

Regardless of the phase difference, the voltage potential between the two grounds creates a signal that can reflect back and forth between the ends of the resonant structure. If a paddle card is provided in the cable connector 100, the grounds are typically commoned in the paddle card near a leading edge of the paddle card (the junction of length B and C in FIG. 1). Thus, the size of the board connector (length B) tends to limit the minimum electrical length and the corresponding maximum signaling frequency that can be used without encountering the resonance condition. FIG. 3A and 3B, however, illustrate the use of a resistive element 148 that couples an intermediate ground plane (ground member 144a) with two different ground traces 121b. The intermediate ground plane and the ground traces are subsequently commoned together before contact pads 125 are coupled to individual wires.

Figure 4:
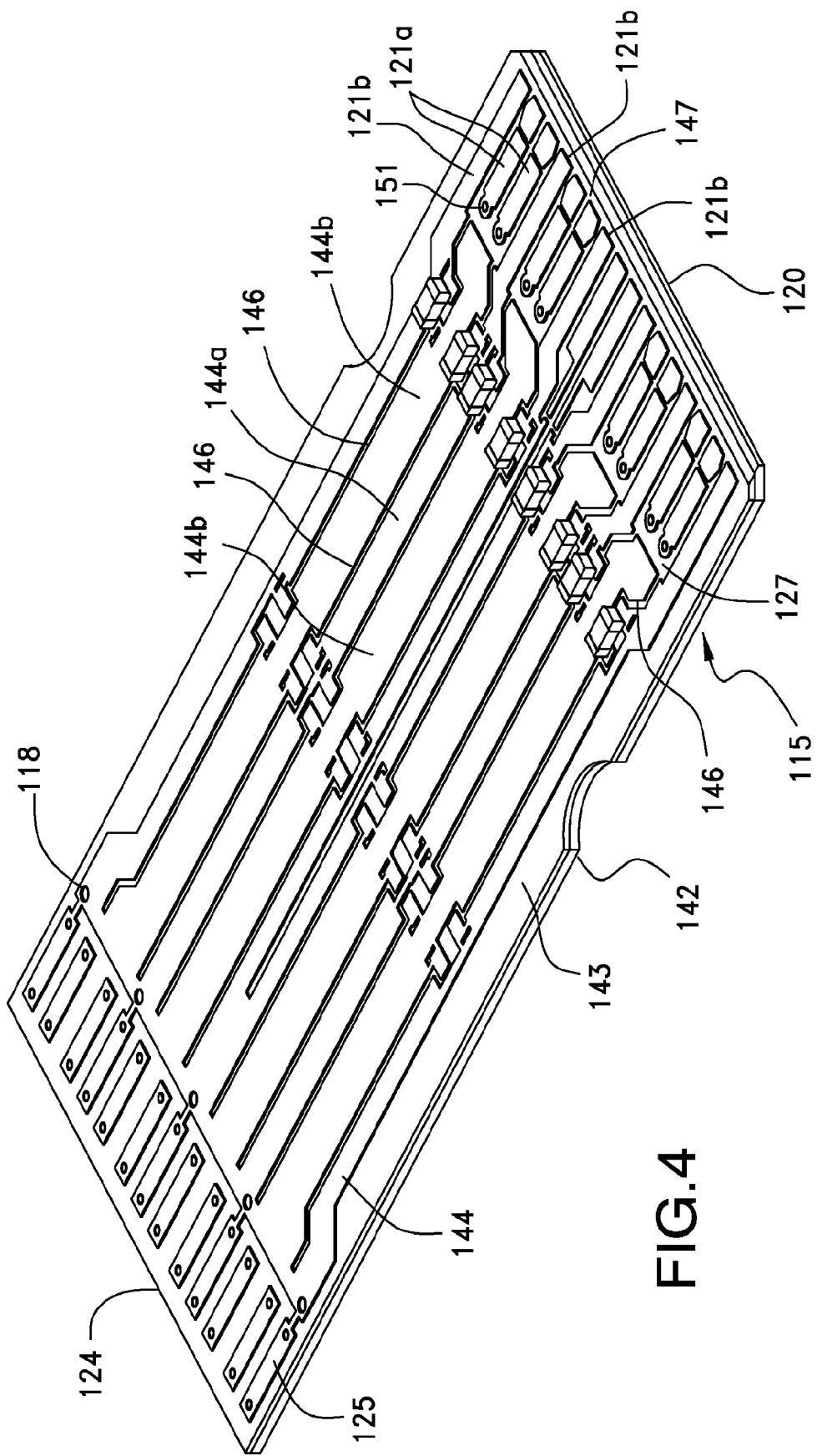
FIG. 4 is a perspective view of an embodiment of a paddle card that has a resonance damping structure integrated therein.

FIG. 4 illustrates an exemplary embodiment of a paddle card 115 that may be used in a connector such as connector 100. As can be appreciated, signal pads 121a, which may be split pads to reduce impedance discontinuities in the signal path, can be surrounded by ground pads in a G-S-S or G-S-S-G pattern. If the former, a ground member 144a between two pairs of signal pads may be commoned to two different ground members 144b. The signal pads are coupled with vias 151 to a signal trace provided on another layer, as discussed below with respect to FIGS. 5A & 5B, which depict the paddle card 115 in an exploded view.

Figure 5A:
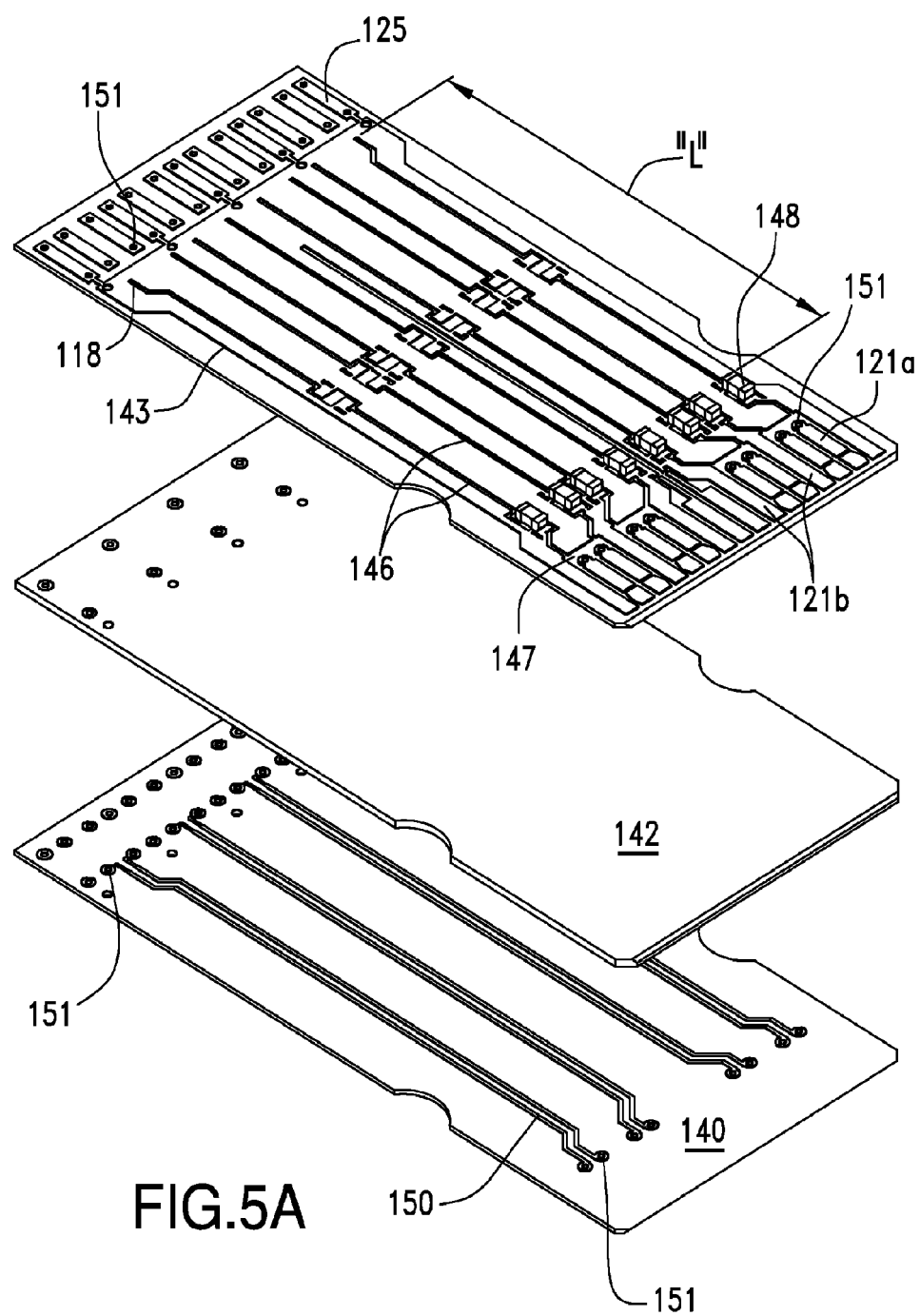
FIG. 5A is an exploded view of the paddle card of FIG. 4.
Figure 5B:
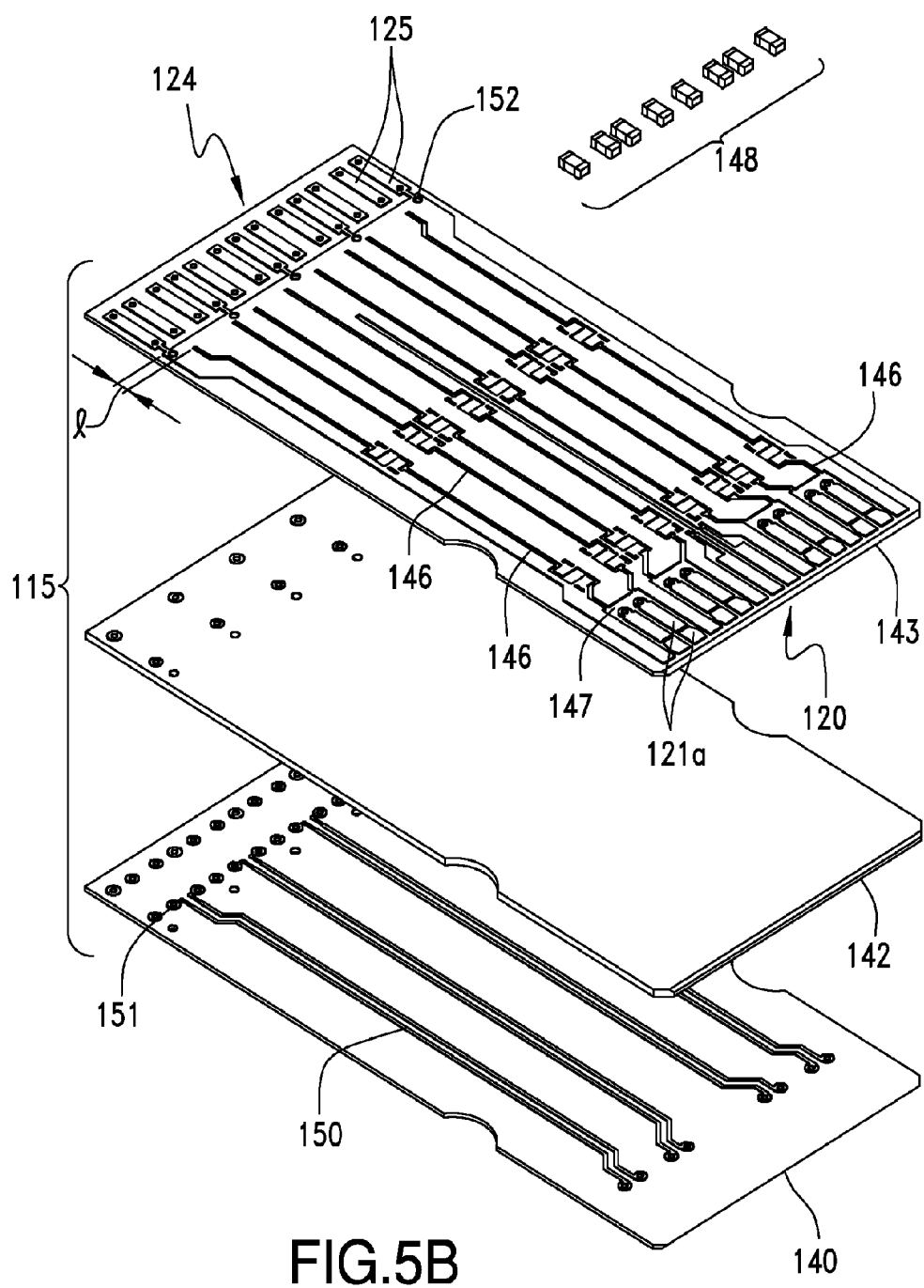
FIG. 5B is the same view as FIG. 5A, but with the resonance damping elements exploded thereon for clarity purposes.

As depicted, the paddle card 115 includes a plurality of distinct layers that are formed in manners well known in the art of circuit board construction. As shown in FIG. 5B, one of the layers 140 includes a circuit trace layer which includes a plurality of conductive traces 150 that extend lengthwise between the opposing leading and trailing edges of the paddle card 115 and which are used to convey signals, preferably differential signals across the paddle card 115. These signal traces are shown as terminating in vias 151 that extend through the various layers of the paddle card 115. There is an insulating layer 142 formed of a typical insulative circuit board material such as FR4, or the like, that lies adjacent to and above the circuit trace layer 140 (as shown in FIGS. 5A & 5B). Lastly, there is a ground plane layer 143 that is disposed adjacent the insulating layers 142. Other additional layers, including ground layers and/or signal layers, may be provided as desired.

Figure 6:
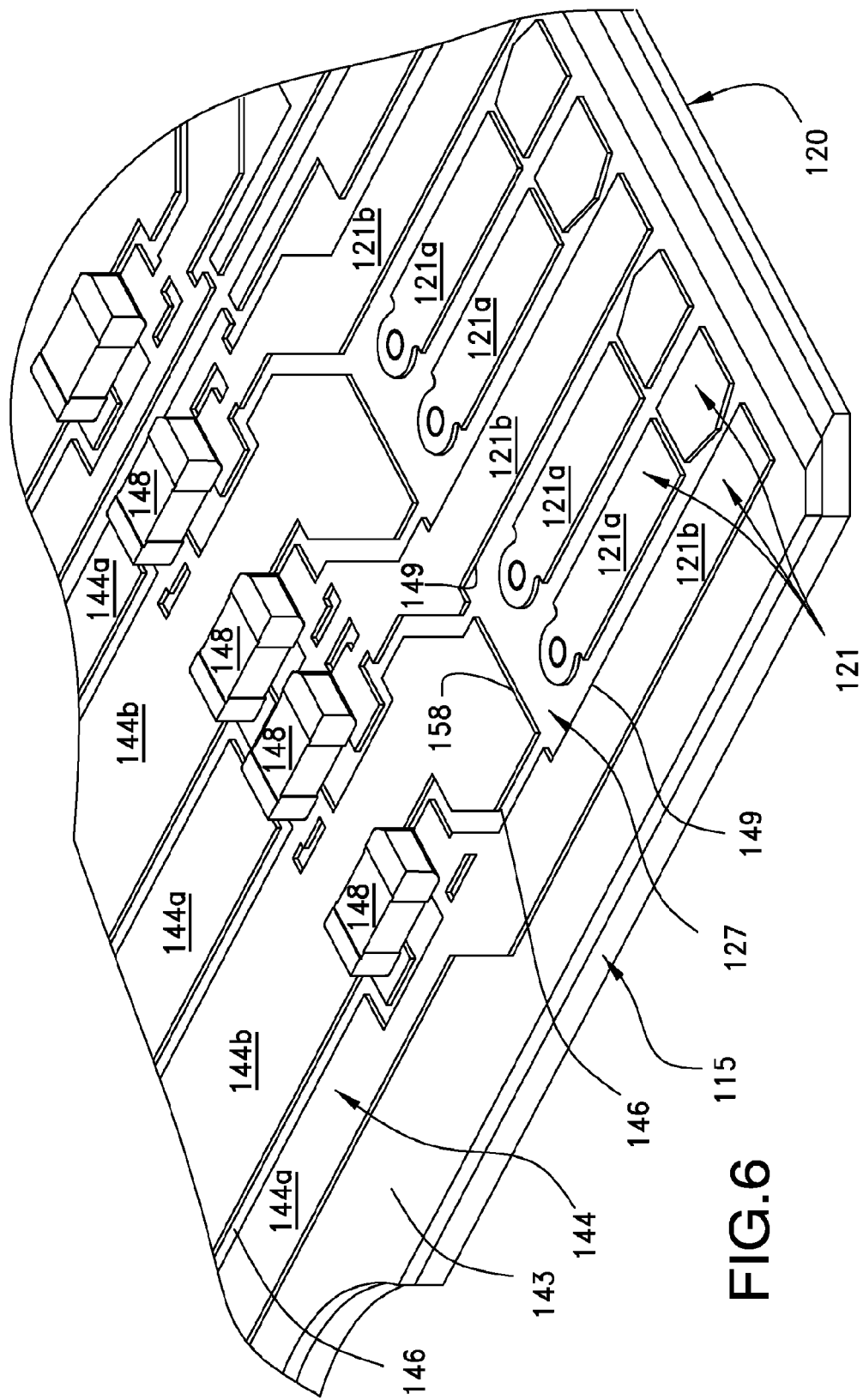
FIG. 6 is an enlarged detail view of the end of the circuit card depicted in FIG. 4.

A shown in FIGS. 4 and 6, the ground plane layer 143 includes a large ground plane 144 that extends lengthwise between the leading and trailing edges 120, 124 of the paddle card 115. This ground plane 144 has a series of lengthwise slots 146 that are formed therein and the slots 146 are spaced apart from each other widthwise of the paddle card 115 as they extend generally between the leading edge contact pads 121a, 121b and the common area 118. As depicted, the common area 118 is positioned close to the end of the card 120 and is coupled to trailing edge termination pads 125. A series of openings 127 is provided in the ground plane 144 and these openings define an area in which the signal contact pads 121a are disposed. The signal contact pads 121a are connected to the signal traces 150 by the vias 151. The openings 127 may be considered as encompassing pairs of the signal contact pads 121a, and providing shielding at the leading edge of the paddle card to each of the differential signal transmission lines of the paddle card 115.

As shown in FIG. 6, the slots 146 are generally aligned with the sides 149 of the openings 127 and they extend proximate to the trailing edge termination pads 125, but end at the common area 118, which is depicted as close to the rearmost extent or edge 152 along a line "l" (FIG. 5B) that extends transversely to the slots 127. These slots 146 define a series of individual ground members 144 which extend lengthwise from where the dampening elements are mounted for about a distance of "L" to the common area of the ground plane members 144. A first set of first and second ground members are electrically isolated from each on the end that couples to terminal contacts (which may be positioned along the leading edge 120 of the paddle card 115). These first set of ground members 144a include extension portions that serve as ground contact 121b (and may be pads), while the other set of ground members 144b end before the contacts. In an embodiment, the second set 144b of ground members can define the rear edge 158 or boundary of the opening 127. The first and second set of ground members (or traces) can serve to surround the differential signal contact members 121a on at least three distinct sides of the openings 127. In an embodiment, however, the rear edge 158 can also be positioned so that the ground members do not extend substantially beyond the dampening elements (e.g., the resistors 148).

Returning to FIG. 1A, and as previously discussed, the potential difference on the grounds A and B can vary independently (by skew or by other causes) such that there is a potential difference between them. The potential difference created by the signals passing through the connector traverses the resonant structure. When the voltage difference between the two grounds is forced into the single ground, a portion of the energy is reflected (in other words, it electrically hits a "wall" and bounces back) as an inverted sine wave, shown in the lemniscate labeled "Without Resonance Damping" in FIG. 1A. As this occurs on both sides of the connector (e.g., at the two points in the system where the separated grounds become joined), a resonant structure is created and a standing wave results. This standing wave tends to degrade the integrity of the signals being transmitted through this transmission line and can, for example, create mode conversion between the ground and the signal pair.

In an embodiment, an arrangement is provided that dampens this resonance, and it utilizes a series of dampening elements 148, which are preferably resistors (and which may have a value of 30 ohms), and that are applied to the paddle card 115. The dampening elements 148 may be aligned with each other along a second line of shorting L2 that also extend transversely to the slots 146 of the ground plane layer. The electrical length L that extends between a common area 118, e.g., the rear ends of the slots 146 and the point at which the resistive elements are attached to the paddle card is preferably equivalent to an electrical length that corresponds to about a quarter wavelength of the frequency desired to be reduced. For example, to providing dampening of a resonance condition, the electrical length L could be configured to be equal to one quarter the associated separated electrical length of the ground terminals (greater lengths are effective but tend to increase the length of the connector while providing reduced rates of return from a dampening standpoint). The dampening elements 148 are applied in a manner to the paddle card 115 so as to interconnect or couple the individual ground members 144a, 144b defined by and separated from each other by the intervening slots 146.

The dampening elements 148 provide a means for dampening the resonance because they absorb energy and dissipate power being carried over the ground terminals. For example, when a signal leaves board 5 and travels through connector 10, the signal encounters the dampening elements on the circuit card 17 and its amplitude is reduced. Depending on the configuration, the amplitude of the reflective wave may decrease significantly and in some instances, may approach zero. The dampened waveform is shown at the bottom of FIG. 1A and is labeled "With Resonance Damping". The resistive elements 148 may be placed as close as possible to the contact pads in order to allow to reduce the separated electrical length and to help keep the total length of the connector as short as possible.

Figure 7:
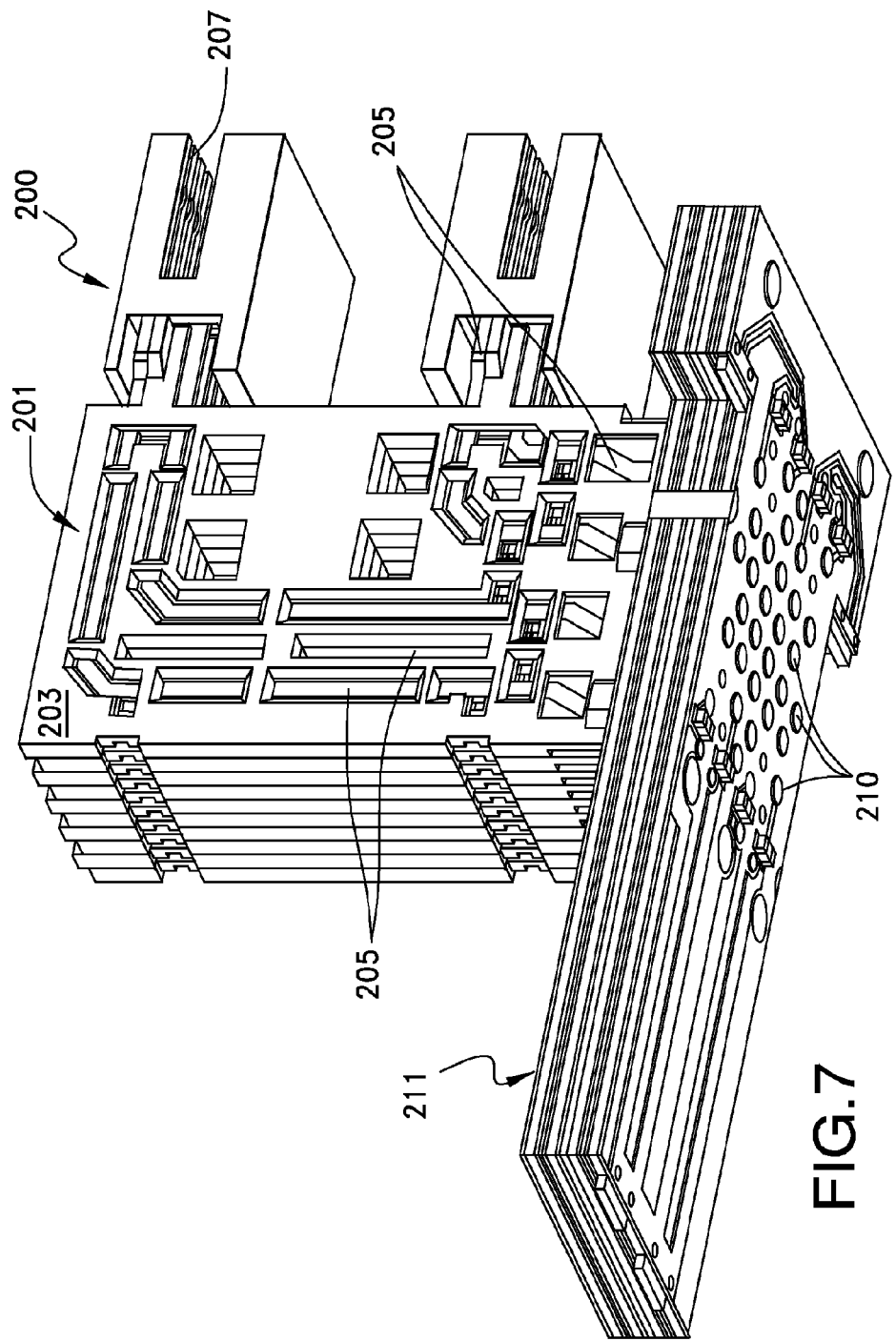
FIG. 7 is a perspective view of another embodiment of a connector mounted to a circuit board, as viewed from below.
Figure 8:
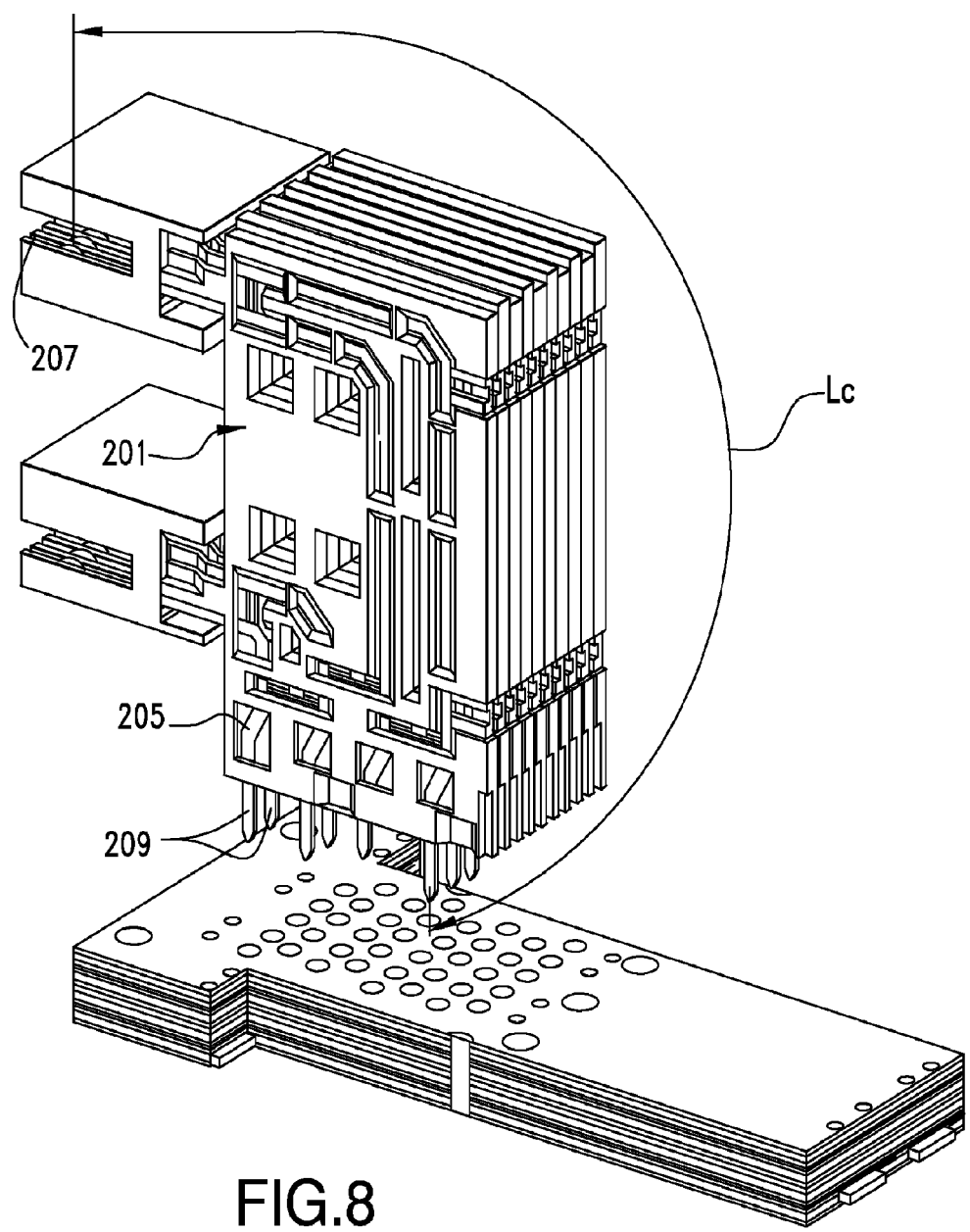
FIG. 8 is a partially exploded view of FIG. 7, taken from above the connector and circuit board and illustrating the connector partially spaced apart from the circuit board.

FIGS. 7-9C illustrate an alternative embodiment of a resonance damping arrangement implemented in a connector system. As shown in FIG. 7, a connector 200 includes a plurality of terminal assemblies 201 shown as insulative wafers 203 that support a plurality of conductive terminals 205. The terminals have contact portions 207 configured to engage contact portions of an opposing, mating connector (not shown), and the terminals have tail portions 209 (FIG. 8) at opposite ends thereof which are adapted to fit in through holes or vias 210 on a circuit board 211. The connector 200 has a specific electrical length, measured in picoseconds, and is equal to the time it takes for a signal to travel from the center point of contact of the terminal contact portions 207 to the center of the terminal tail portion 209 on the opposite end of the terminal. For the discussion to follow, the connector electrical length will be designated Lc and it is shown diagrammatically in FIG. 8. If each terminal is separated from other terminals, then the separated electrical length of one of the ground terminals positioned in the connector 200 is at least Lc. It should be noted that in this style of connector, the terminals can be held in discrete sets of signal, ground and function terminals, e.g., certain wafers may support only ground terminals, certain wafers may support only signal terminals and certain wafers may support only functional terminals such as power terminals. As can be appreciated, however, such construction is not required.

The connector 200 of the depicted embodiment is a two port connector and is designed to mate with two opposing mating connectors, typically a circuit card mating blade of an electronic module. Other configurations, such as a single port or multiple-port connector, are also contemplated. Thus, the features depicted have applicability to a wide range of connector types. In an embodiment, the terminals that extend to each port are spaced apart from each other in the body of the connector. This spaced apart nature can also be provided in the mating circuit board, however for density purposes the vias are typically grouped more tightly on the circuit board.

As noted above, when separated ground terminal are provided, each ground terminals can have a different potential and, depending on the coupling of the signal terminals to the ground terminals, a significant amount of energy can be transmitted over the ground terminals. The potentials that exist will tend to create reflections and resonances in the connector (as discussed above).

The tails of the terminals are positioned in vias 235a and are not connected to the common ground plane. Instead, a trace 221 extends from the via 235a to a via 232 and the via 232 is coupled to the common ground plane. Between the two vias a first contact 227 is provided on the trace 221 and a second contact 227 is also provided that is electrically coupled to the first contact by a dampening element 223. The second contact 227 is electrically coupled to a via 235a, which is also coupled to the ground plane. Thus, there is a first electrical length $l_1$ which extends from the via 235a where the ground is still separated from other grounds. However, at the location of the contacts 227, a dampened coupling to the ground plane is made. Because the connector is dampened, it tends to absorb and covert into heat the energy that might exist due to there being a potential between the ground and the ground plane. Furthermore, because this dampened coupling is an electrical distance of $l_2$, which may be a quarter (¼) of the separated electrical length of the ground terminal in the connector (which effectively is at least Lc plus $L_1$), the eventually non-dampened coupling between the ground terminal and the ground plane is sufficiently distant so as to allow the energy to be absorbed by the dampening element. In other words, since the point of coupling to the ground plane via the dampening element is encountered first and the other point of coupling appears to be electrically distant, the energy tends to travel through the dampening element. The dampening element, which may be a resistive element, consequently allows the energy to dissipate as heat and significantly reduces (or even eliminates) the excess electrical energy. Thus, the system sees a reduction or elimination of undesirable resonance.

A circuit board may be tuned for a specific connector system by determining the separated electrical length of the ground terminals in the connector and then configuring $l_2$ or $l_4$ so that they are about a quarter of the sum of the separated electrical length. It should also be noted that for certain connector designs where the resonance issues associated with the separated electrical length of the ground terminals is/are less pronounced, the electrical length provided by $L_2$ and $l_4$ can be configured for some other frequency of interest.

This same approach can also be accomplished with the traces configured to provide electrical lengths $l_3$ and $l_4$. Thus, as can be appreciated, the traces 221 that couple the ground terminal via 235a to the via 232 that couples the trace to the ground plane in a non-dampened manner can meander or extend in a relatively straight path. It should be noted that as depicted, the vias 232 are approximate an edge, such as edge 250. As can be appreciated, however, the coupling of the trace to the ground plane need not be positioned near an edge of the circuit board.

Figure 9A:
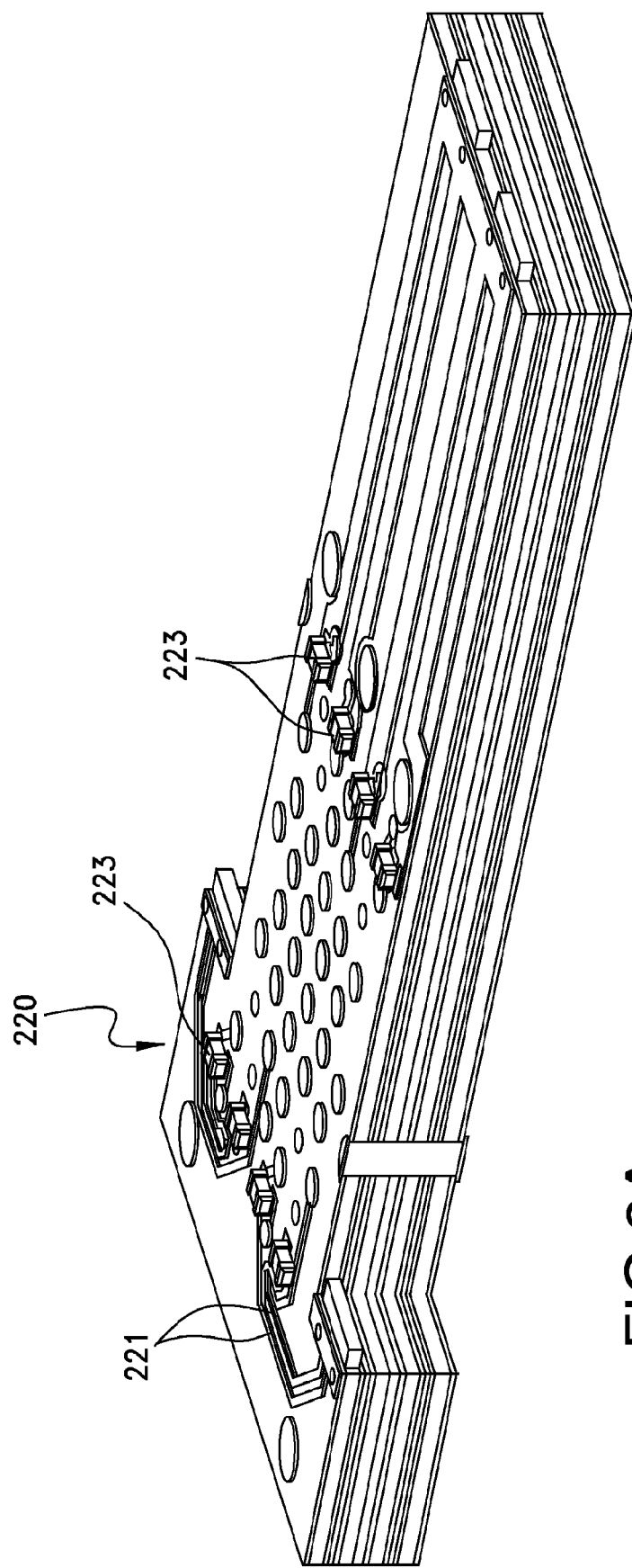
FIG. 9A is a perspective view of the underside of the circuit board depicted in FIG. 7.
Figure 9B:
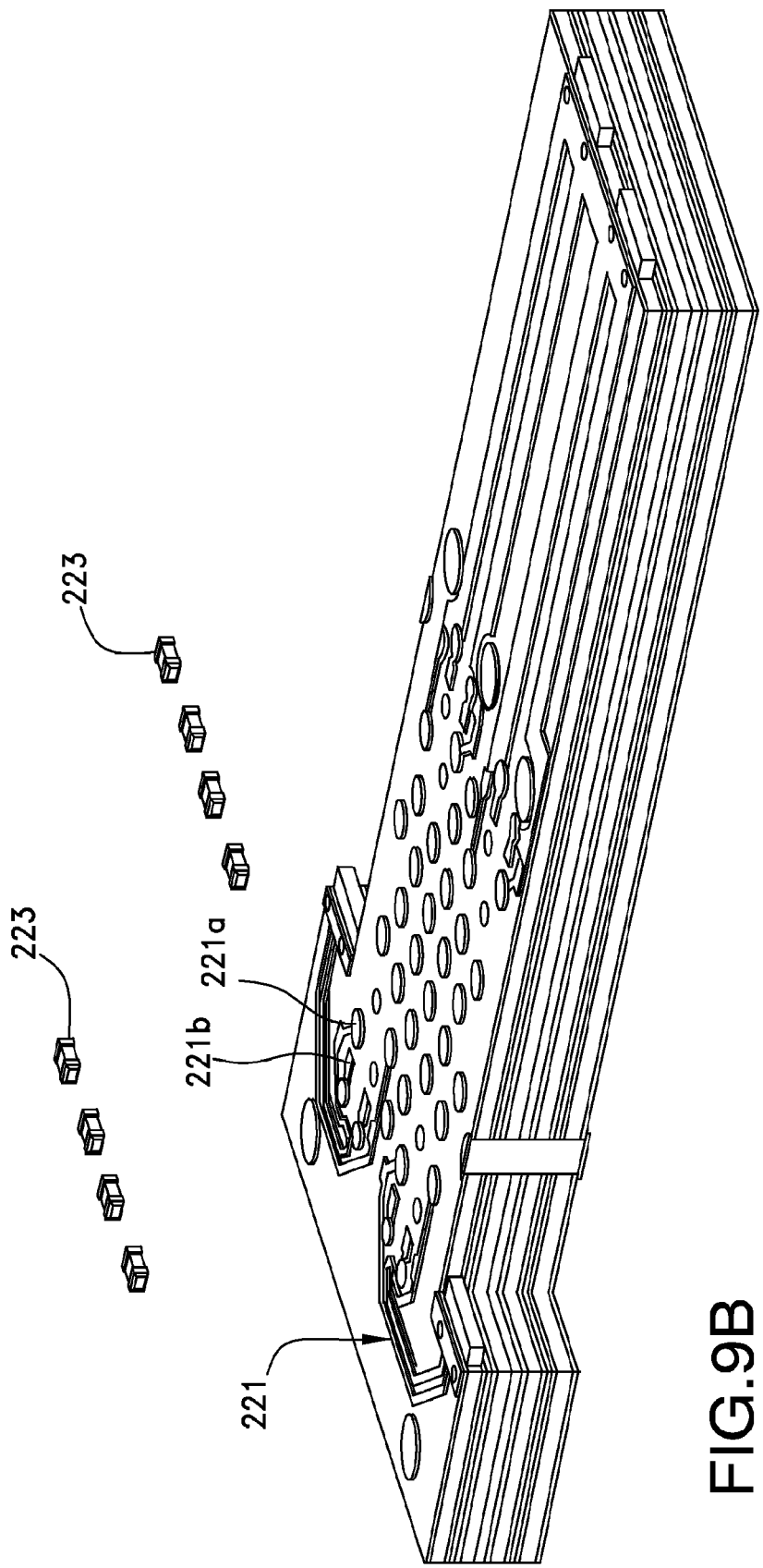
FIG. 9B is a partially exploded view of the embodiment depicted in FIG. 9A.
Figure 9C:
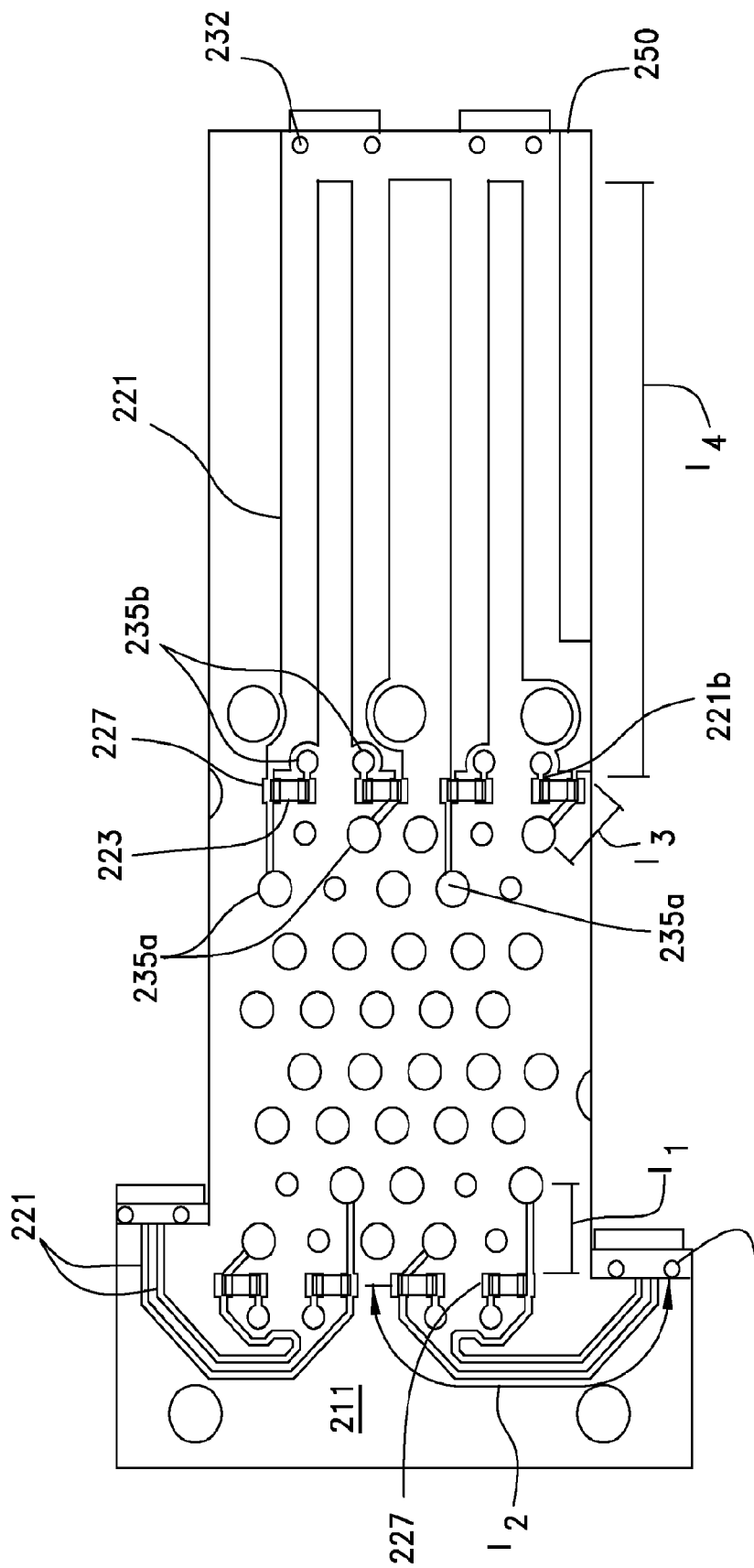
FIG. 9C is a bottom plan view of the circuit board depicted in FIG. 7.
Figure 9D:
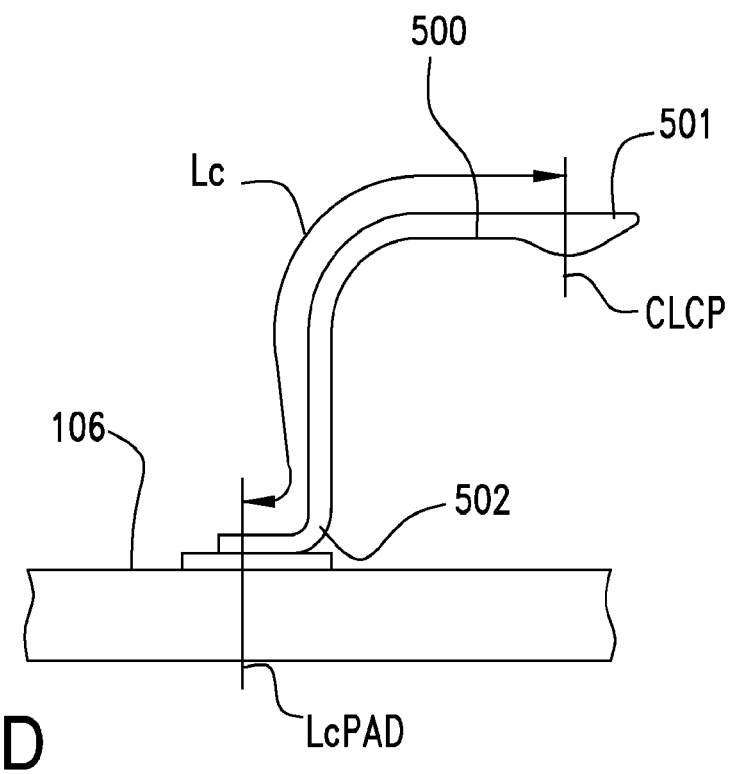
FIG. 9D is a diagrammatic view of a connector terminal with a surface mount tail attached to a contact pad and illustrating the electrical length Lc for such a connector terminal.
Figure 9E:
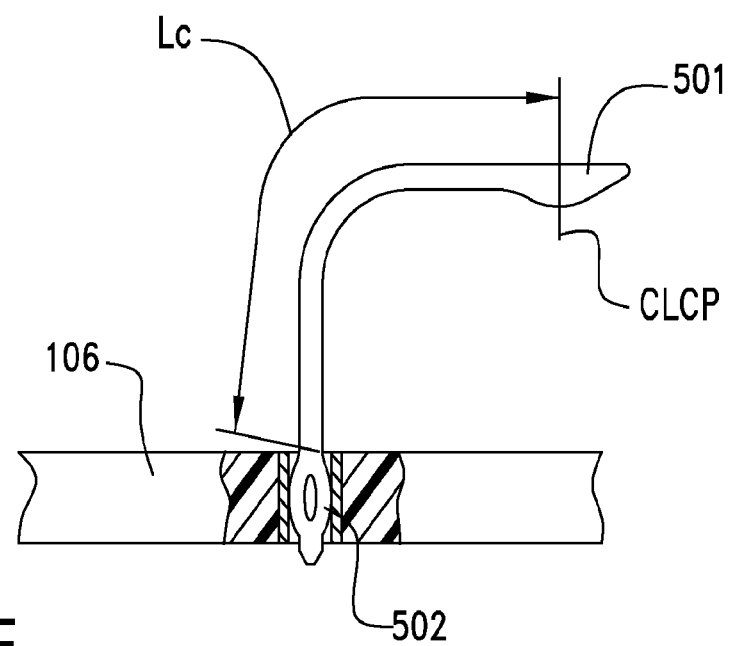
FIG. 9E is the same view as FIG. 9D but for a connector terminal with a through hole tail.

It should be noted that the separated electrical length Lc is determined by the terminal geometry and the average dielectric constant provided by the corresponding connector and is the time that is takes a signal to traverse the terminal 500 from its contact end 501 to its tail end 502. For example, as shown in FIG. 9D, the electrical length Lc of a surface mount terminal can be defined as the time that it takes to traverse from the center of the terminal contact end 501, shown by endline CLCP in FIG. 9D to the center of the contact pad Lcpad. A through hole terminal is shown in FIG. 9E and the Lc of that terminals can be defined as the time it takes for the signal to travel from the center of the contact end CLCP to the center of the through-hole tail at a level even with the surface of the circuit board 106.

Figure 10:
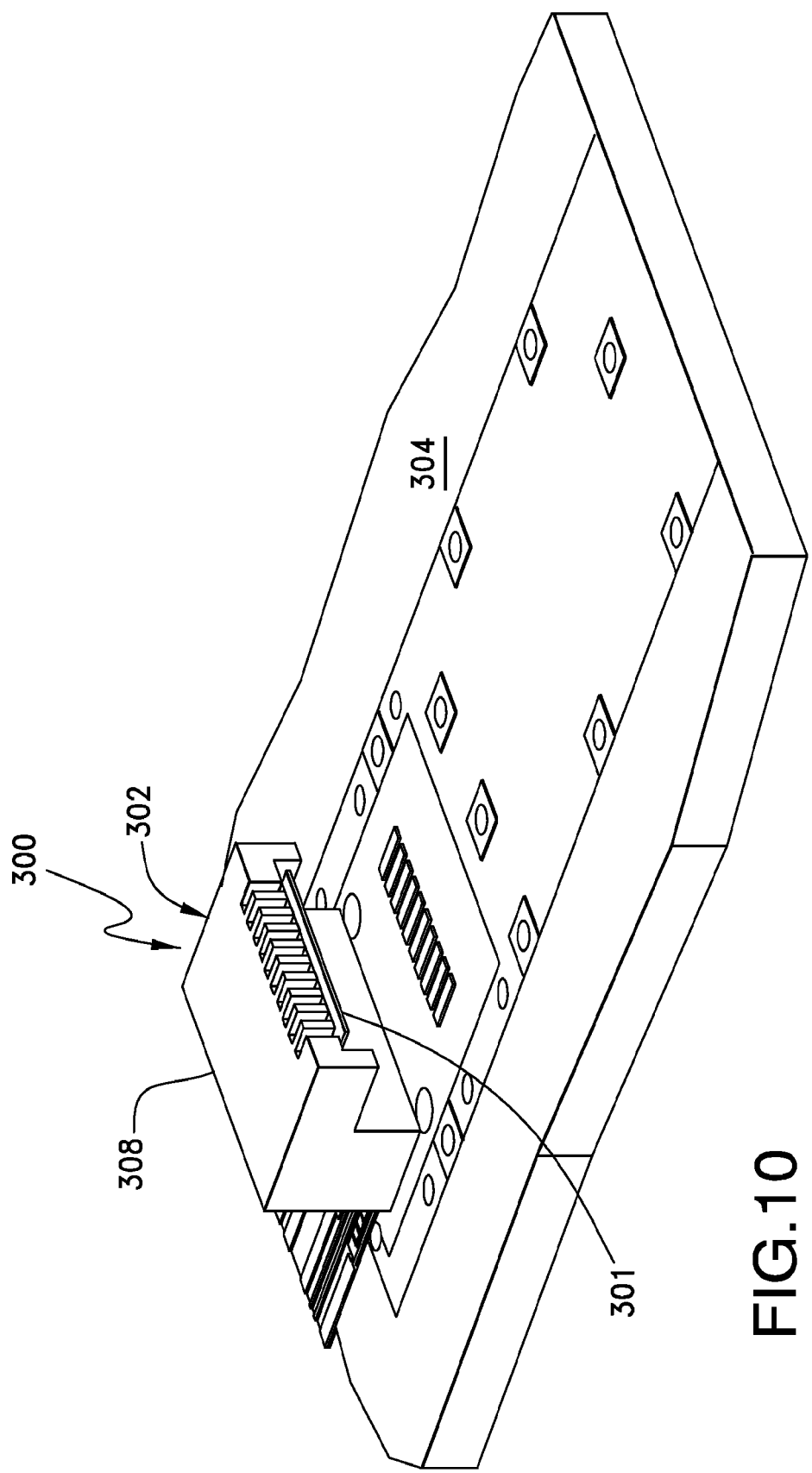
FIG. 10 is a perspective view of another embodiment of a connector system.
Figure 10A:
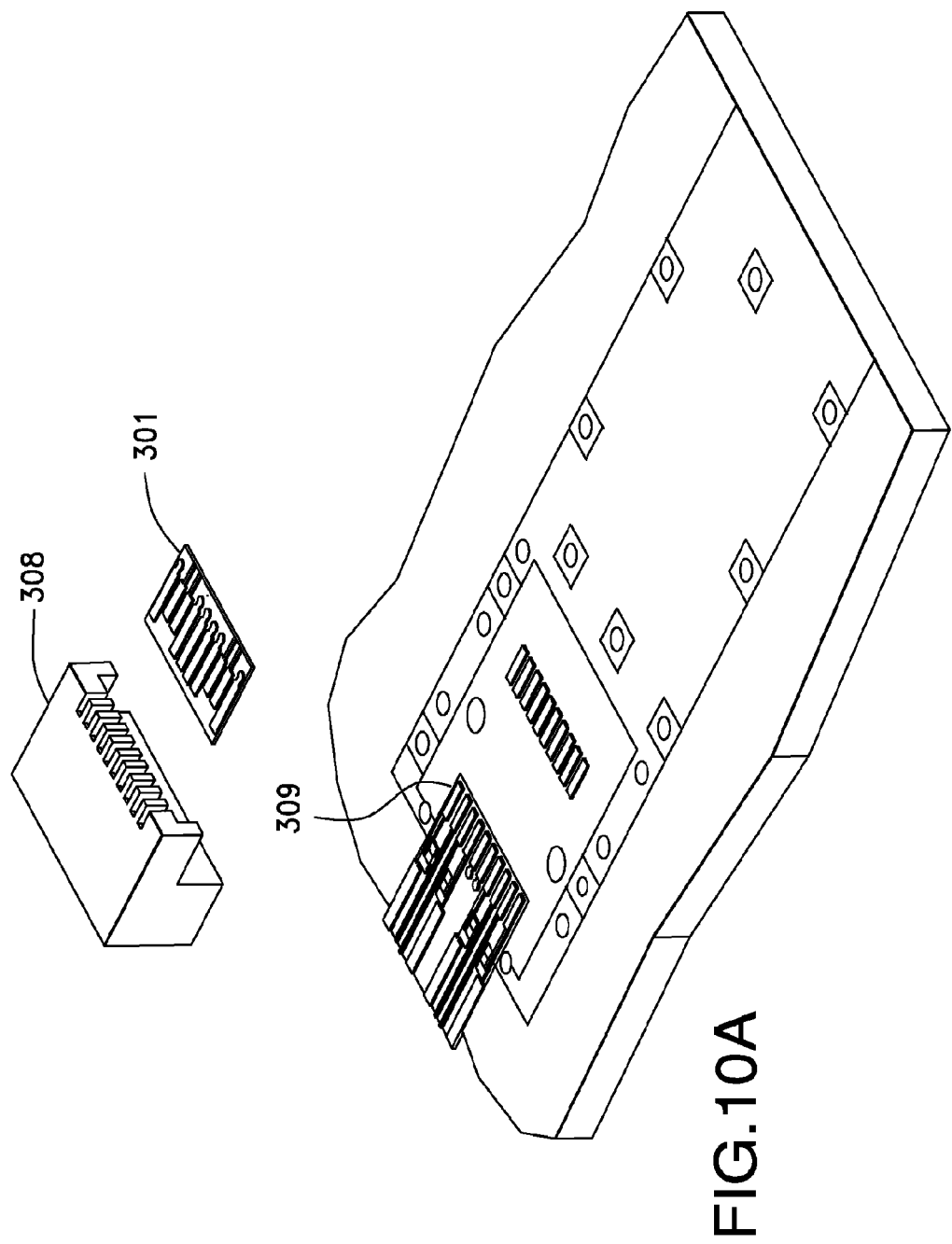
FIG. 10A is a partially exploded view of the system depicted in FIG. 10.
Figure 10B:
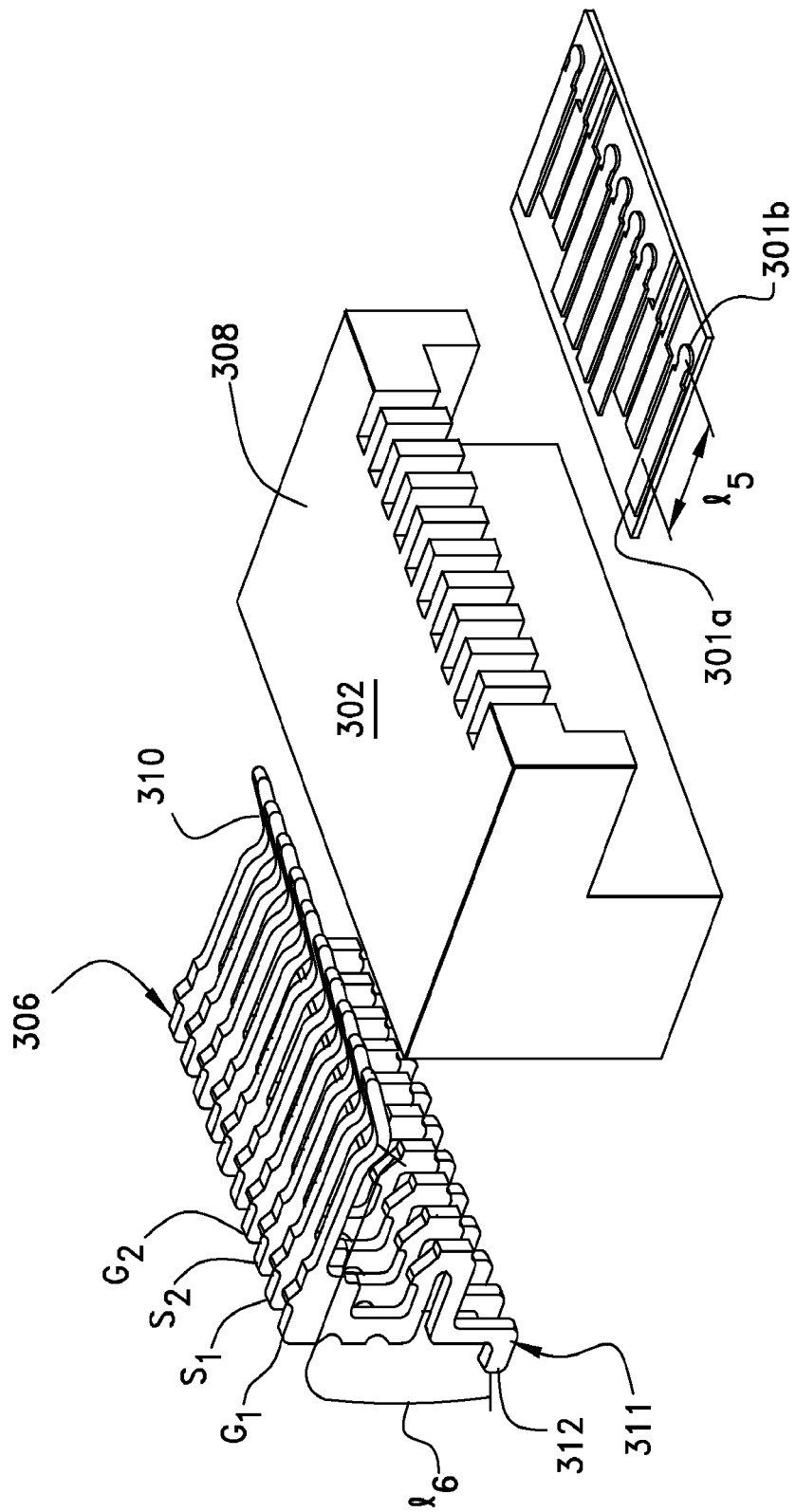
FIG. 10B is an exploded view of the connector depicted in FIG. 10.
Figure 10C:
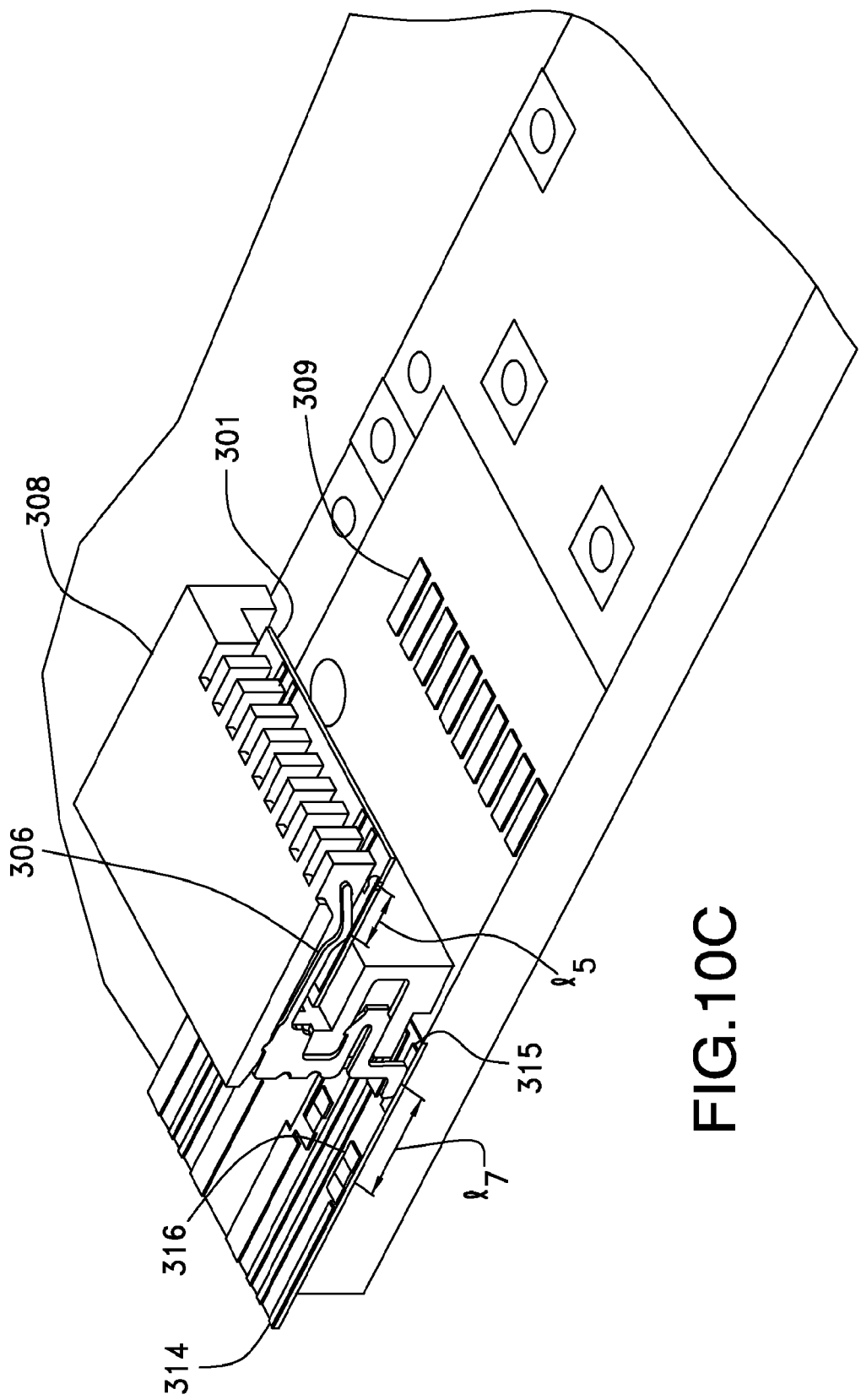
FIG. 10C is a perspective view of a cross-section of the connector system depicted in FIG. 10.
Figure 11:
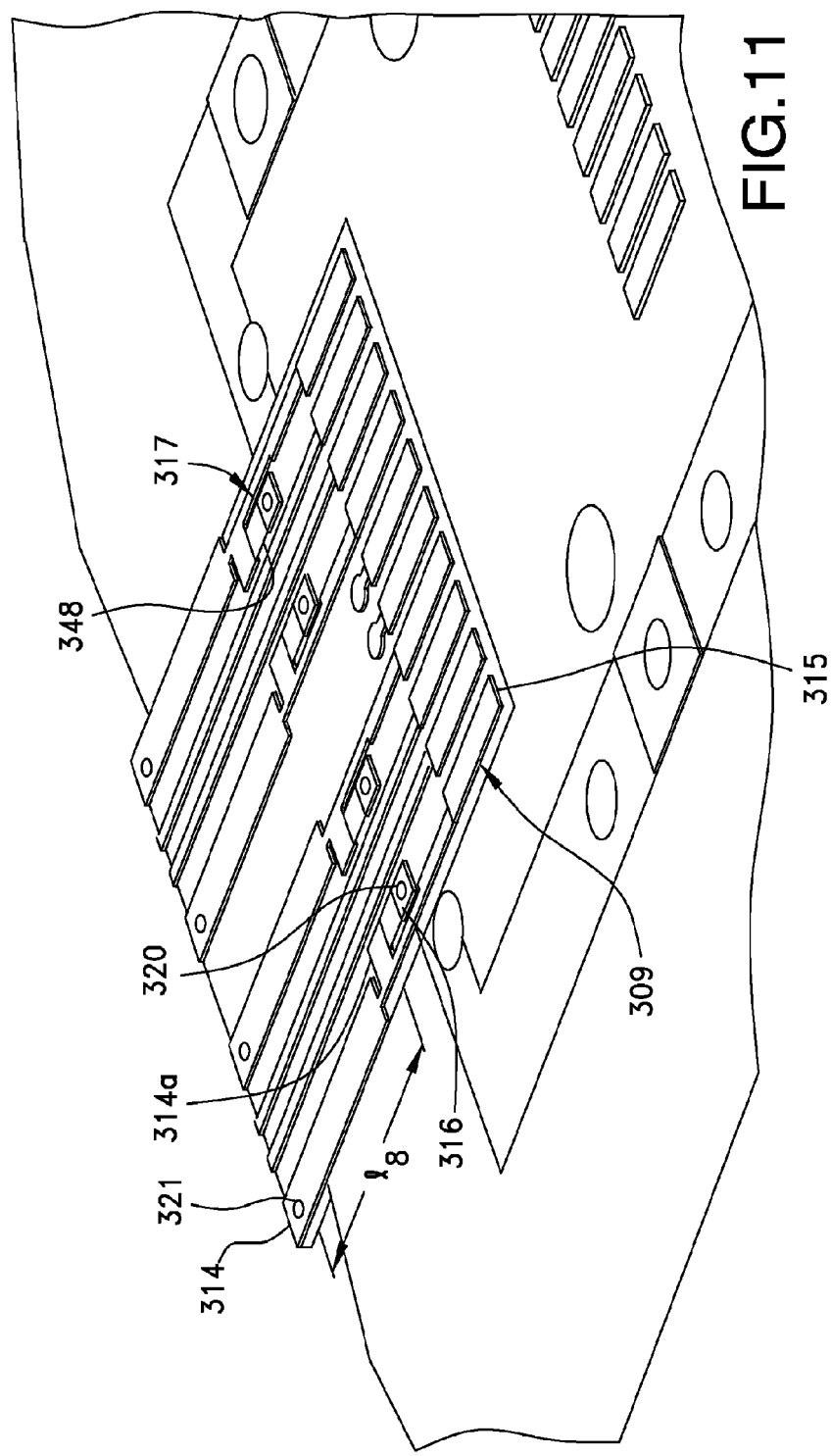
FIG. 11 is a perspective view of the circuit board depicted in the connector system of FIG. 10.
Figure 12:
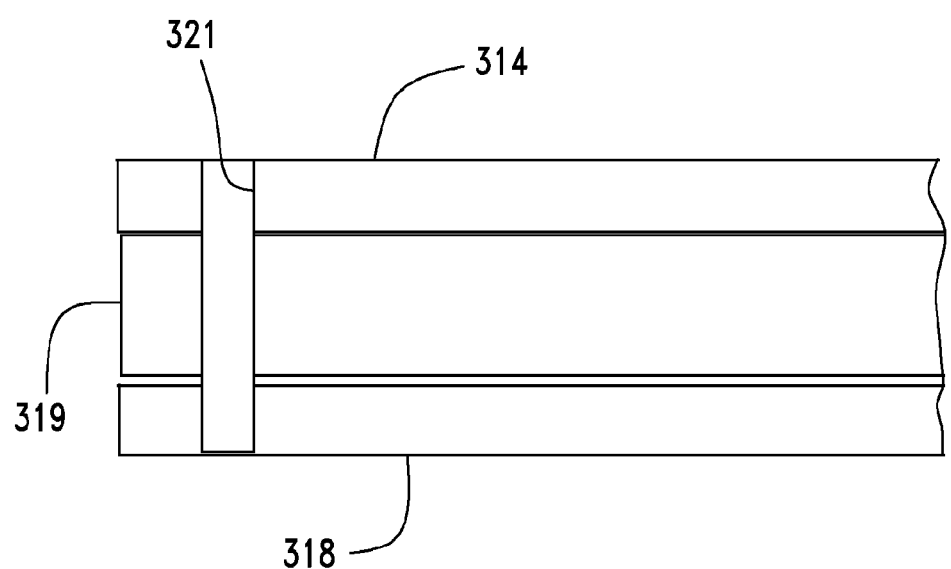
FIG. 12 is a schematic cross-section of an embodiment of a circuit board.

Turning now to FIGS. 10-12, another embodiment of a resonance damping system 300 is depicted and it is suitable for use with a surface mount style connector. As shown, a connector 302 is mounted to a circuit board 304. A paddle card 301 is shown in an installed position but the portion of the connector that would support the paddle card 301 is omitted for purposes of clarity. As can be appreciated, there are a large number of variations in connectors used to support paddle cards and this disclosure is not intended to be limited in that respect.

The connector 302 is shown in a simplified manner as additional features typically would be used to support the paddle card 301 in position. For example, without limitation, multiple rows of terminals could be supported by the connector 302. It should be noted that the connector 302 could be configured to support multiple rows of terminals and each row would mount on a corresponding row of pads 309 on the circuit board. The connector 302 includes conductive terminals 306 held in an insulative housing 308. The terminals of the connector 300 are preconfigured for use as signal or ground terminals, meaning that certain ones are assigned to transmit differential signals and others to transmit ground signals. The differential signal terminals are arranged in pairs of signal terminals and each such terminal pair is typically flanked by a pair of ground terminals. The terminals have distinct contact portions 310 and tail portions 311 disposed at opposite ends thereof and the tail portions 311 in this embodiment include surface mount feet 312. The terminals 306 can be segregated in groups within the terminals, e.g., the terminals can be arranged in a pattern such as a repeating G-S-S pattern crosswise through the connector.

As noted above, the separated length of a ground terminal is one feature that is of interest. As a paddle card typically will include a common ground plane over a portion of the paddle card length, the length of the separated portion of the ground terminal starts from via 301b where the paddle card 301 separates into pad 301a. The paddle card thus contributes an electrical length $l_5$ to the total separated electrical length of a particular ground terminal. The separated length continues through length $l_6$, which represents the electrical length of the terminals 306 in the connector 302. The terminal contacts a pad 315 and the effective separated length of the terminal extends an additional length $l_7$ until it reaches a dampening element 348.

As depicted, a primary ground trace 314 and a secondary ground trace 316 are associated with each surface mount ground terminal tail portion. The primary ground trace 314 extends from conductive contact pad 315. As depicted, the primary ground traces 314 extend in a straight line, however it should be noted that a meandering path could also be provided if desired. The secondary ground trace 316 is positioned proximate the primary ground trace and a gap 317 is provided between the secondary ground trace 316 and the primary ground trace 314 that is bridged by the dampening element 148 (which may be a resistor). As can be appreciated, the circuit board 304 may include a ground plane 318 that is spaced apart from the primary ground trace 314 (as well as the secondary ground trace 316) by an intervening insulative layer 319. As can be appreciated, additional layers may be added as desired.

A first via 320 couples the secondary ground trace 316 to the ground plane 318 and a second via 321 couples the primary ground trace to the ground plane 318. The primary trace 314 may include a contact spur 314a that is used to couple to the secondary ground trace 316 and an gap 317 is provided between them so that a dampening element 348 (such as a resistor) can electrically bridge the gap 317 and electrically couple the primary ground trace 314 to the secondary ground trace 316. The distance between the location of the electrical coupling of the primary and secondary trace until the second via provides an electrical length $l_8$. The distance may be configured so that the electrical length $l_8$ (in picoseconds) is about ¼ the separated electrical length (e.g., $l_5+l_6+l_7$). As noted above, however, if the resonance to be dampened is at a higher frequency than that corresponding to the separated electrical length then the length $l_8$ can be further reduced.

Therefore, referring back to FIG. 1, it can be appreciated that a resonance allowed for in a structure (such as in connector 10) can be compensated for on either side of the structure. In addition, the configuration of the resonance compensation can be varied depending on which frequency is of interest in a particular system. In other words, the frequency of interest and the resultant predetermined electrical length can be set as desired.

The disclosure provided herein describes features in terms of preferred and exemplary embodiments thereof Numerous other embodiments, modifications and variations within the scope and spirit of the appended claims will occur to persons of ordinary skill in the art from a review of this disclosure.

We claim:

1. A connector system, comprising:
   a housing;
   a paddle card supported by the housing, the paddle card including a first and second end and have a first layer and a second layer, the first end configured to engage terminals;
   a first and second ground trace positioned on the first layer and extending respectively from a first and second ground contact pad positioned toward the first end to a common area positioned toward the second end, the first and second ground trace separated at the first end and joined together at the common area;
   a third ground trace positioned on the first layer between the first and second ground trace and extending from a rear edge to the common area; the third ground trace separate from the first and second ground trace between the rear end and the common area; and
   a first and second dampening element respectively coupling the first and second ground trace to the third ground trace, the first and second dampening element positioned a predetermined distance from the common area.

2. The system of claim 1, further comprising a cable with a first end and a second end, the first coupled to the connector, the cable including a ground shield electrically coupled to the common area.

3. The system of claim 2, further comprising a second connector coupled to the cable on the second end, the second connector configured as the first connector and coupled to the ground shield of the cable.

4. The system of claim 1, wherein the first and second dampening element are positioned closer to the first end than the second end.

5. The system of claim 4, wherein the predetermined distance is configured to equate to a quarter wave length of a predetermined frequency.

6. The system of claim 1, further comprising two signal contact pads positioned between the first and second contact pad, the two signal contact points coupled to signal traces provided in the second layer.

7. The system of claim 6, wherein the third ground trace extends to a point between where the dampening elements are coupled to the third ground trace and the two signal contact points.

8. The system of claim 1, wherein the dampening elements comprise resistors.

9. The system of claim 1, wherein the dampening elements are positioned along a line that extends perpendicular to a longitudinal axis of the paddle card, the longitudinal axis extending from the first end to the second end.

10. The system of claim 1, further comprising a fourth, fifth and sixth ground trace positioned on the first layer, the fourth and fifth ground trace configured to be arranged with respect to each other substantially the same as the first and second ground trace are arranged, the fourth and fifth ground trace spaced apart from the first and second ground trace, the sixth ground trace positioned between the fourth and fifth ground trace and configured substantially the same as the third ground trace.

11. The system of claim 1, wherein the paddle card construction is selected from the group of a multilayer circuit card and a single dielectric layer with the first layer on a first side and the second layer on a second side.

12. A circuit card, comprising:
   an insulative layer that extends from a first edge to a second edge;
   a first and second ground contact pad positioned along the first edge on opposite sides of a pair of signal contact pads;
   a first ground trace extending from the first ground contact pad to a common area;
   a second ground trace extending from the second ground contact pad to the common area;
   a third ground trace with a rear edge positioned between the first and second ground trace and extending to the common area; and
   a first and second dampening element coupling the third ground trace respectively to the first and second ground trace, the first and second dampening element positioned a predetermined distance from the common area.

13. The circuit card of claim 12, further comprising a third and fourth ground contact pad positioned in a row formed by the first and second ground contact pad, wherein a fourth, fifth and sixth ground trace are positioned on the insulative layer, the fourth ground trace coupled to the third ground contact pad and the fifth ground trace coupled to the fourth grand contact pad, the fourth and fifth ground trace configured to be arranged with respect to each other substantially the same as the first and second ground trace are arranged, the fourth and fifth ground trace spaced apart from the first and second ground trace, the sixth ground trace positioned between the fourth and fifth ground trace and configured substantially the same as the third ground trace.

14. The circuit card of claim 13, wherein the dampening elements are resistors.

15. The circuit card of claim 14, wherein the resistors have a value of about 30 ohms.

16. The circuit card of claim 12, wherein the predetermined distance is configured to provide an electrical length of one quarter of a separated electrical length of a ground terminal configured to mate with the circuit card.

* * * * *